(12) United States Patent
Bonitz

(10) Patent No.: US 10,762,971 B2
(45) Date of Patent: Sep. 1, 2020

(54) RESPONDING TO POWER LOSS

(71) Applicant: MICRON TECHNOLOGY, INC., Boise, ID (US)

(72) Inventor: Rainer Bonitz, Bruckmuehl (DE)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 16/446,827

(22) Filed: Jun. 20, 2019

(65) Prior Publication Data
US 2019/0304551 A1 Oct. 3, 2019

Related U.S. Application Data

(62) Division of application No. 15/691,840, filed on Aug. 31, 2017, now Pat. No. 10,373,694.

(51) Int. Cl.
| | | |
|---|---|---|
| G11C 16/34 | (2006.01) | |
| G11C 16/08 | (2006.01) | |
| G11C 5/14 | (2006.01) | |
| G11C 14/00 | (2006.01) | |
| G11C 16/26 | (2006.01) | |
| G11C 16/04 | (2006.01) | |

(52) U.S. Cl.
CPC .......... G11C 16/3418 (2013.01); G11C 5/144 (2013.01); G11C 14/0063 (2013.01); G11C 16/08 (2013.01); G11C 16/04 (2013.01); G11C 16/26 (2013.01)

(58) Field of Classification Search
CPC . G11C 16/3418; G11C 5/144; G11C 14/0063; G11C 16/08; G11C 16/04; G11C 16/26

USPC .................................................... 365/185.02
See application file for complete search history.

(56) References Cited

U.S. PATENT DOCUMENTS

| | | | |
|---|---|---|---|
| 5,396,637 A | * | 3/1995 | Harwell ............. G06F 11/1441 365/228 |
| 5,592,416 A | | 1/1997 | Bontiz et al. |
| 5,914,895 A | | 6/1999 | Jenne |
| 6,414,873 B1 | | 7/2002 | Herdt |
| 6,965,524 B2 | | 11/2005 | Choi |
| 7,016,227 B2 | | 3/2006 | Inoue |

(Continued)

OTHER PUBLICATIONS

International Search Report and Written Opinion of the International Searching Authority for Application No. PCT/US2018/044033 dated Nov. 2, 2018 (12 pages).

*Primary Examiner* — Viet Q Nguyen
(74) *Attorney, Agent, or Firm* — Dicke, Billig & Czaja, PLLC

(57) ABSTRACT

Apparatus including an array of volatile memory cells and a differential storage device configured to receive information indicative of a data value stored in a particular memory cell of the array of volatile memory cells and having a first non-volatile memory cell connected between a first isolation gate and a voltage node configured to receive a first voltage level and a second non-volatile memory cell connected between a second isolation gate and the voltage node, wherein a gate of the second non-volatile memory cell is connected to a gate of the first non-volatile memory cell. The apparatus further logic responsive to an indication of a loss of power to the apparatus and the information indicative of the data value stored in the particular memory cell.

20 Claims, 16 Drawing Sheets

(56) References Cited

U.S. PATENT DOCUMENTS

| | | | |
|---|---|---|---|
| 7,089,349 B2* | 8/2006 | Chang | G06F 12/0246 |
| | | | 711/103 |
| 7,164,608 B2 | 1/2007 | Lee | |
| 7,181,611 B2* | 2/2007 | Chang | G06F 11/0763 |
| | | | 713/1 |
| 7,280,397 B2 | 10/2007 | Scheuerlein | |
| 7,307,872 B2 | 12/2007 | Kang et al. | |
| 7,321,951 B2* | 1/2008 | Wong | G11C 29/50 |
| | | | 711/103 |
| 7,395,452 B2 | 7/2008 | Nicholson et al. | |
| 7,518,916 B2 | 4/2009 | Ashokkumar et al. | |
| 7,536,506 B2* | 5/2009 | Ashmore | G06F 1/3203 |
| | | | 711/114 |
| 7,663,917 B2 | 2/2010 | Cuppens et al. | |
| 7,710,776 B2 | 5/2010 | Johal et al. | |
| 7,760,540 B2 | 7/2010 | Still | |
| 8,018,768 B2 | 9/2011 | Shih et al. | |
| 8,077,511 B2 | 12/2011 | Pesavento | |
| 8,194,438 B2 | 6/2012 | Ahn et al. | |
| 8,315,096 B2 | 11/2012 | Allan et al. | |
| 8,817,536 B2 | 8/2014 | Scade et al. | |
| 8,892,831 B2* | 11/2014 | Khmelnitsky | G06F 13/4239 |
| | | | 711/162 |
| 8,929,163 B2 | 1/2015 | Taylor et al. | |
| 8,947,122 B2 | 2/2015 | Prabhakar | |
| 9,202,577 B2* | 12/2015 | Mangold | G11C 16/16 |
| 9,286,203 B2* | 3/2016 | Abraham | G06F 9/00 |
| 9,502,109 B2 | 11/2016 | Taniguchi et al. | |
| 9,514,816 B1 | 12/2016 | Ashokkumar et al. | |
| 9,588,565 B1* | 3/2017 | Harland | G06F 1/28 |
| 9,697,897 B2 | 7/2017 | Sadd et al. | |
| 9,817,576 B2* | 11/2017 | Hayes | G06F 3/0607 |
| 9,933,955 B1* | 4/2018 | Gosla | G06F 3/0656 |
| 10,192,626 B1* | 1/2019 | Bonitz | G11C 16/225 |
| 10,373,694 B2* | 8/2019 | Bonitz | G11C 16/08 |
| 10,379,694 B2* | 8/2019 | Park | G06F 3/0416 |
| 10,541,032 B2* | 1/2020 | Tang | G11C 16/225 |
| 10,607,702 B1* | 3/2020 | Bonitz | G11C 11/5628 |
| 2005/0162896 A1 | 7/2005 | Jung | |
| 2005/0283648 A1* | 12/2005 | Ashmore | G06F 1/3203 |
| | | | 714/5.11 |
| 2006/0062049 A1 | 3/2006 | Lee et al. | |
| 2006/0101301 A1 | 5/2006 | Nagao et al. | |
| 2007/0002619 A1 | 1/2007 | Schoenauer et al. | |
| 2012/0275209 A1 | 11/2012 | Evans, Jr. | |
| 2012/0286851 A1 | 11/2012 | Yoneda | |
| 2014/0189199 A1* | 7/2014 | Blount | G06F 12/0802 |
| | | | 711/103 |
| 2015/0016188 A1 | 1/2015 | Tailliet et al. | |
| 2015/0162063 A1 | 6/2015 | Mueller | |
| 2016/0216901 A1 | 7/2016 | Takeshita | |
| 2019/0371415 A1* | 12/2019 | Cesaretti | G11C 16/22 |

* cited by examiner

10,762,971 B2

RESPONDING TO POWER LOSS

RELATED APPLICATION

This Application is a Divisional of U.S. application Ser. No. 15/691,840, titled "RESPONDING TO POWER LOSS," filed Aug. 31, 2017, issued as U.S. Pat. No. 10,373,694 on Aug. 6, 2019, which is commonly assigned and incorporated herein by reference.

TECHNICAL FIELD

The present disclosure relates generally to memory and, in particular, in one or more embodiments, the present disclosure relates to methods and apparatus for responding to power loss to the apparatus.

BACKGROUND

Memory devices are typically provided as internal, semiconductor, integrated circuit devices in computers or other electronic devices. There are many different types of memory including random-access memory (RAM), static RAM (SRAM), read only memory (ROM), dynamic random access memory (DRAM), synchronous dynamic random access memory (SDRAM), and flash memory.

Flash memory has developed into a popular source of non-volatile memory for a wide range of electronic applications. Flash memory typically use a one-transistor memory cell that allows for high memory densities, high reliability, and low power consumption. Changes in threshold voltage (Vt) of the memory cells, through programming (which is often referred to as writing) of charge storage structures (e.g., floating gates or charge traps) or other physical phenomena (e.g., phase change or polarization), determine the data state (e.g., data value) of each memory cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory is a common type of flash memory device, so called for the logical form in which the basic memory cell configuration is arranged. Typically, the array of memory cells for NAND flash memory is arranged such that the control gate of each memory cell of a row of the array is connected together to form an access line, such as a word line. Columns of the array include strings (often termed NAND strings) of memory cells connected together in series between a pair of select gates, e.g., a source select transistor and a drain select transistor. Each source select transistor may be connected to a source, while each drain select transistor may be connected to a data line, such as column bit line. Variations using more than one select gate between a string of memory cells and the source, and/or between the string of memory cells and the data line, are known.

SRAM memory is often referred to as bistable as it may maintain one of two stable data state through the use of internal feedback as long as the memory cells receive power. SRAM memory tends to facilitate faster access, e.g., programming and reading, than flash memory. In addition, a data state of an SRAM memory cell can be changed without first erasing, as is often necessary with flash memory. Furthermore, SRAM memory is capable of maintaining its data state without requiring a refresh operation, as is often necessary with RAM memory.

Because of particular advantages, SRAM memory finds multiple uses. For example, cache memory for processors, disk drives and solid-state drives might utilize SRAM memory. In addition, due to their fast access and easy re-write, SRAM memory might be utilized for data logging in many vehicle subsystems, including infotainment systems, instrument cluster, engine control, driver assistance and black boxes. Although an SRAM memory cell does not require a refresh operation to maintain its data state, a loss of power in an uncontrolled manner, e.g., asynchronous power loss, will cause its data to be lost.

DETAILED DESCRIPTION

Figure 1A:
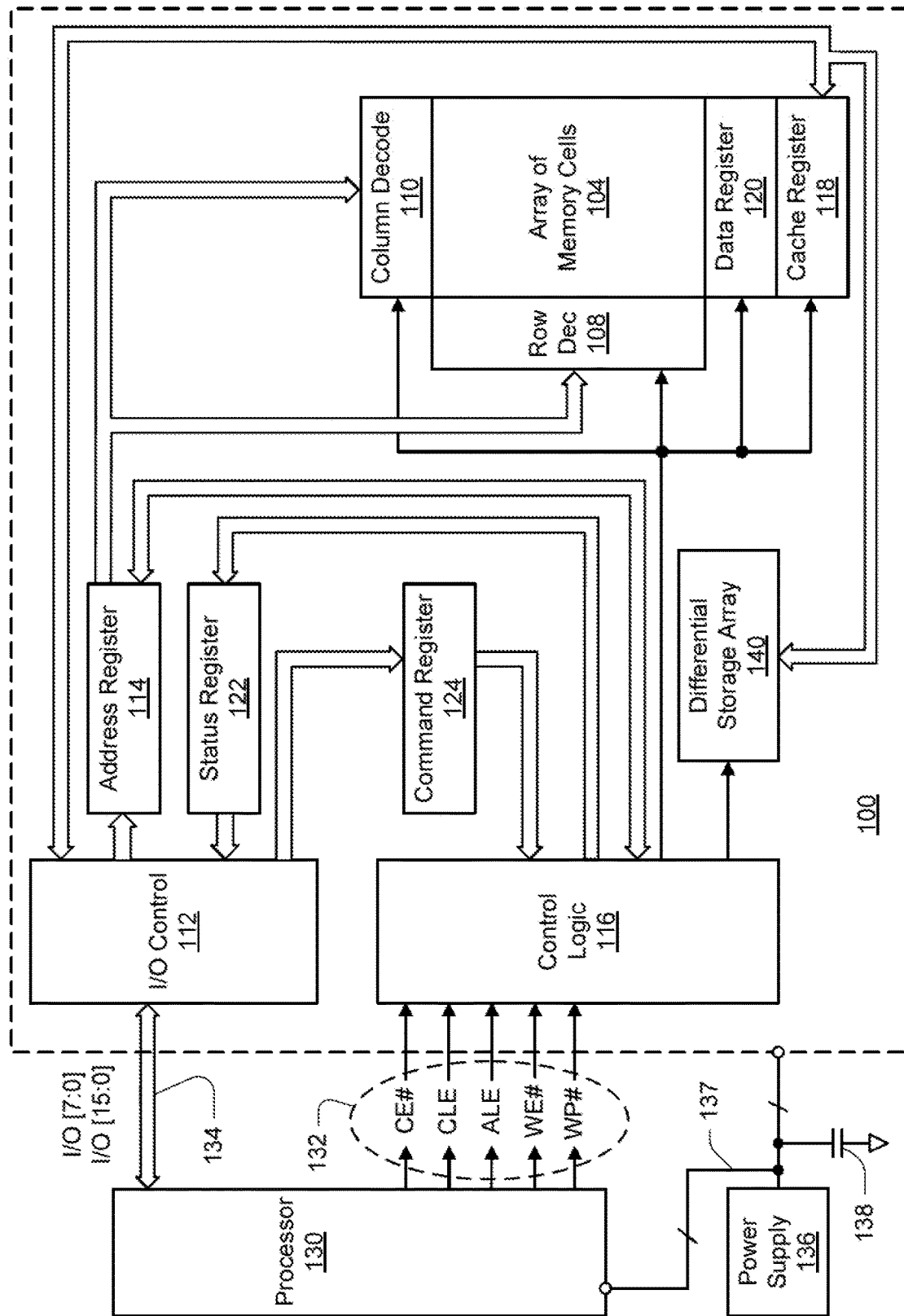
FIG. 1A is a simplified block diagram of a memory in communication with a processor as part of an electronic system, according to an embodiment.

In the following detailed description, reference is made to the accompanying drawings that form a part hereof, and in which is shown, by way of illustration, specific embodiments. In the drawings, like reference numerals describe substantially similar components throughout the several views. Other embodiments may be utilized and structural, logical and electrical changes may be made without departing from the scope of the present disclosure. The following detailed description is, therefore, not to be taken in a limiting sense.

The term "semiconductor" used herein can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps may have been utilized to form regions/junctions in the base semiconductor structure, and the term semiconductor can include the underlying layers containing such regions/junctions. The term conductive as used herein, as well as its various related forms, e.g., conduct, conductively, conducting, conduction, conductivity, etc., refers to electrically conductive unless otherwise apparent from the context. Similarly, the term connecting as used herein, as well as its various related forms, e.g., connect, connected, connection, etc., refers to electrically connecting unless otherwise apparent from the context. Although particular values of voltages may be given in the description to aid understanding, such voltages are dependent upon the specific design, materials and technology used in fabrication in manners understood by those in the field of integrated circuit fabrication, design and operation.

Automobiles and other vehicles are becoming increasingly technologically advanced. Infotainment, instrument cluster, engine control and driver assistance areas, for example, typically utilize larger and larger amounts of memory as these systems become increasingly complex. Some of these memory uses are system critical to the safety and/or reliability of the vehicle. In addition, these systems may log data related to crash events. While SRAM memory may be capable of logging large amounts of data quickly, this data would be lost if the SRAM memory lost power.

Various embodiments may facilitate preservation of data stored in an SRAM memory if a power loss event is indicated. Such embodiments utilize a differential storage device having associated logic to initiate (e.g., automatically initiate) backup of data stored in an SRAM memory in response to an indication that a power loss has occurred. Due to its differential nature, determining the data state of the differential storage device may be facilitated with only minor changes in threshold voltage. As such, a verify operation may be unnecessary following programming. Furthermore, programming times might be shortened compared to programming of a typical array of flash memory cells. It may thus be possible to obtain sufficient programming of the differential storage devices without the need for an added hold-up capacitance or other energy storage device as is typically used to store data in response to a power loss event.

FIG. 1A is a simplified block diagram of a first apparatus, in the form of a memory (e.g., memory device) 100, in communication with a second apparatus, in the form of a processor 130, and a third apparatus, in the form of a power supply 136, as part of a fourth apparatus, in the form of an electronic system, according to an embodiment. For some embodiments, the power supply 136 may be external to an electronic system containing the processor 130 and the memory device 100. Some examples of electronic systems include personal computers, personal digital assistants (PDAs), digital cameras, digital media players, digital recorders, games, appliances, vehicles, wireless devices, mobile telephones, removable memory modules and the like. The processor 130, e.g., a controller external to the memory device 100, may represent a memory controller or other external host device.

Memory device 100 includes an array of memory cells 104 logically arranged in rows and columns. Memory cells of a logical row are typically connected to the same access line (commonly referred to as a word line) while memory cells of a logical column are typically selectively connected to the same data line (commonly referred to as a bit line) or to a pair of complementary data lines (commonly referred to as a data line and a data bar line). A single access line may be associated with more than one logical row of memory cells and a single data line, or pair of complementary data lines, may be associated with more than one logical column. The array of memory cells 104 might represent an array of volatile (e.g., SRAM) memory cells. The array of memory cells 104 might additionally represent an array of non-volatile (e.g., flash) memory cells. While the array of memory cells 104 is depicted to be in communication with a single row decode circuitry 108, column decode circuitry 110, data register 120 and cache register 118, embodiments including an array of volatile memory cells and an array of non-volatile memory cells may include separate access circuitry for each such array of memory cells.

The row decode circuitry 108 and column decode circuitry 110 are provided to decode address signals. Address signals are received and decoded to access the array of memory cells 104, e.g., for programming operations, read operations, erase operations, etc. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands.

A controller, such as an internal controller (e.g., control logic 116), controls access to the array of memory cells 104 in response to the commands and generates status information for the external processor 130, i.e., control logic 116 may be configured to perform backup operations (e.g., backup and restore operations) in accordance with embodiments described herein. The control logic 116 is in communication with row decode circuitry 108 and column decode circuitry 110 to control the row decode circuitry 108 and column decode circuitry 110 in response to the addresses.

Control logic 116 is also in communication with a cache register 118 and data register 120. Cache register 118 latches data, either incoming or outgoing, as directed by control logic 116 to temporarily store data while the array of memory cells 104 is busy writing or reading, respectively, other data. During a programming operation (e.g., often referred to as a write operation), data is passed from the cache register 118 to the data register 120 for transfer to the array of memory cells 104; then new data is latched in the cache register 118 from the I/O control circuitry 112. During a read operation, data is passed from the cache register 118 to the I/O control circuitry 112 for output to the external processor 130; then new data is passed from the data register 120 to the cache register 118. A status register 122 is in communication with I/O control circuitry 112 and control logic 116 to latch the status information for output to the processor 130. For embodiments where the array of memory cells 104 includes an array (e.g., sub-array) of volatile memory cells and an array (e.g., sub-array) of non-volatile memory cells, the array of volatile memory cells and the array of non-volatile memory cells might each have a separate row decode circuitry 108, column decode circuitry 110, cache register 118 and data register 120.

Control logic 116 is further in communication with a differential storage array 140 in accordance with an embodiment. The differential storage array 140 may further be connected to data nodes (not shown in FIG. 1A) of a plurality of memory cells of the array of memory cells 104. The differential storage array 140 may contain one or more differential storage devices (not shown in FIG. 1A) in accordance with an embodiment. For example, the differential storage array 140 may include a respective differential storage device for each memory cell of the array of memory cells 104.

Memory device 100 receives control signals at control logic 116 from processor 130 over a control link 132. The control signals may include at least a chip enable CE #, a command latch enable CLE, an address latch enable ALE, a write enable WE #, and a write protect WP #. Additional control signals (not shown) may be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands are received over input/output (I/O) pins [7:0] of I/O bus 134 at I/O control circuitry 112 and are written into command register 124. The addresses are received over input/output (I/O) pins [7:0] of bus 134 at I/O control circuitry 112 and are written into address register 114. The data are received over input/output (I/O) pins [7:0] for an 8-bit device or input/output (I/O) pins [15:0] for a 16-bit device at I/O control circuitry 112 and are written into cache register 118. The data are subsequently written into data register 120 for programming the array of memory cells 104. For another embodiment, cache register 118 may be omitted, and the data are written directly into data register 120. Data are also output over input/output (I/O) pins [7:0] for an 8-bit device or input/output (I/O) pins [15:0] for a 16-bit device.

Memory device 100 and/or processor 130 may receive power from the power supply 136. Power supply 136 may represent any combination of circuitry for providing power to memory device 100 and/or processor 130. For example, power supply 136 might include a stand-alone power supply (e.g., a battery), a line-connected power supply (e.g., a switched-mode power supply common in desktop computers and servers or an AC adapter common for portable electronic devices), or a combination of the two.

Power is typically received from the power supply 136 using two or more voltage supply nodes 137, such as a supply voltage node (e.g., Vcc) and a reference voltage node (e.g., Vss or ground). It is not uncommon for a power supply 136 to provide more than two voltage supply nodes 137. For example, a common standard for switched-mode power supplies, ATX (Advanced Technology eXtended) 2.x, provides, using a 28-pin connection, four voltage supply nodes (or pins) at +3.3V, five voltage supply nodes at +5V, four voltage supply nodes at +12V, one voltage supply node at 12V, and ten voltage supply nodes at a reference voltage (e.g., 0V). The ATX 2.x standard further provides a power-on node for activating the foregoing voltage supply nodes when it is pulled to ground by an external circuit, a standby voltage supply node driven to +5V regardless of whether the other voltage supply nodes are being driven to their respective voltage levels (which can be used to power the external circuit responsible for pulling the power-on node to ground), and a power-good node for indicating when the other voltage supply nodes are stabilized at their respective voltages. The remaining pin of the ATX 2.x 28-pin standard may be undefined. Memory device 100 and processor 130 may utilize differing combinations of voltage supply nodes 137 from power supply 136 depending upon their respective power needs. For simplicity, distribution of power from the voltage supply nodes 137 to components within the memory device 100 is not depicted.

The voltage supply nodes 137, or other components of the electronic system, may have an inherent or added energy storage device, such as capacitance 138, e.g., a hold-up capacitance, that can provide power to the memory device 100, and optionally to the processor 130, for some finite amount of time in the case of failure or removal of the power supply 136. Sizing of the capacitance 138 can be readily determined based on the power requirements of at least the memory device 100 for the operations described herein. While the energy storage device is depicted as the capacitance 138 in examples herein, the capacitance 138 could alternatively represent a battery. Furthermore, while the capacitance 138 is depicted to be external to the memory device 100, it could alternatively be an internal component of the memory device 100.

It will be appreciated by those skilled in the art that additional circuitry and signals can be provided, and that the memory device 100 of FIG. 1A has been simplified. It should be recognized that the functionality of the various block components described with reference to FIG. 1A may not necessarily be segregated to distinct components or component portions of an integrated circuit device. For example, a single component or component portion of an integrated circuit device could be adapted to perform the functionality of more than one block component of FIG. 1A. Alternatively, one or more components or component portions of an integrated circuit device could be combined to perform the functionality of a single block component of FIG. 1A.

Additionally, while specific I/O pins are described in accordance with popular conventions for receipt and output of the various signals, it is noted that other combinations or numbers of I/O pins may be used in the various embodiments.

Figure 1B:
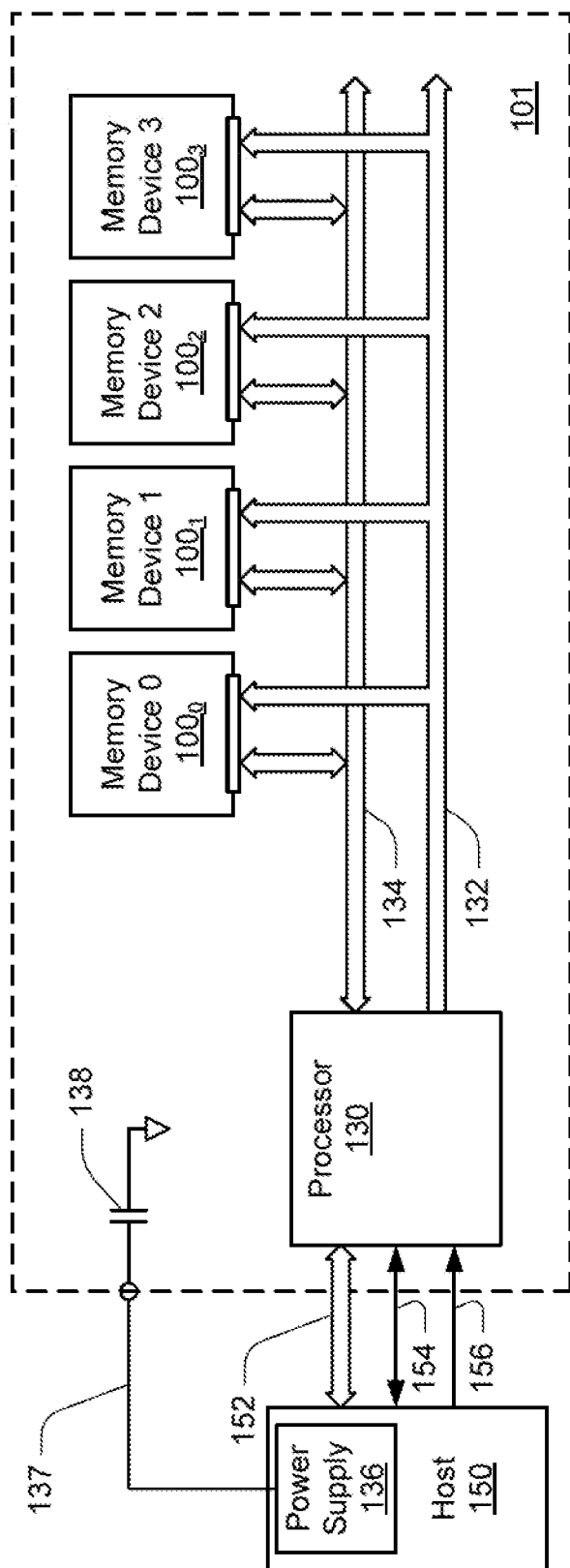
FIG. 1B is a simplified block diagram of an apparatus in the form of a memory module in communication with a host as part of an electronic system, according to another embodiment

A given processor 130 may be in communication with one or more memory devices 100, e.g., dies. FIG. 1B is a simplified block diagram of an apparatus in the form of a memory module 101 in communication with a host 150 as part of an electronic system, according to another embodiment. Memory devices 100, processor 130, control link 132, I/O bus 134, power supply 136, voltage supply nodes 137 and capacitance 138 may be as described with reference to FIG. 1A. For simplicity, distribution of power from the voltage supply nodes 137 to the memory devices 100 and processor 130 within the memory module 101 is not depicted. Although memory module (e.g., package) 101 of FIG. 1B is depicted with four memory devices 100 (e.g., dies), memory module 101 could have some other number of one or more memory devices 100. One or more of the memory devices 100 may include an array of memory cells 104 containing an array of volatile (e.g., SRAM) memory cells. In addition, one or more of the memory devices 100 may include an array of memory cells 104 containing an array of non-volatile (e.g., flash) memory cells.

Because processor 130 (e.g., a memory controller) is between the host 150 and the memory devices 100, communication between the host 150 and the processor 130 may involve different communication links than those used between the processor 130 and the memory devices 100. For example, the memory module 101 may be an Embedded MultiMediaCard (eMMC) of a solid state drive (SSD). In accordance with existing standards, communication with an eMMC may include a data link 152 for transfer of data (e.g., an 8-bit link), a command link 154 for transfer of commands and device initialization, and a clock link 156 providing a clock signal for synchronizing the transfers on the data link 152 and command link 154. The processor 130 may handle many activities autonomously, such as power-loss detection, error correction, management of defective blocks, wear leveling and address translation.

Figure 2A:
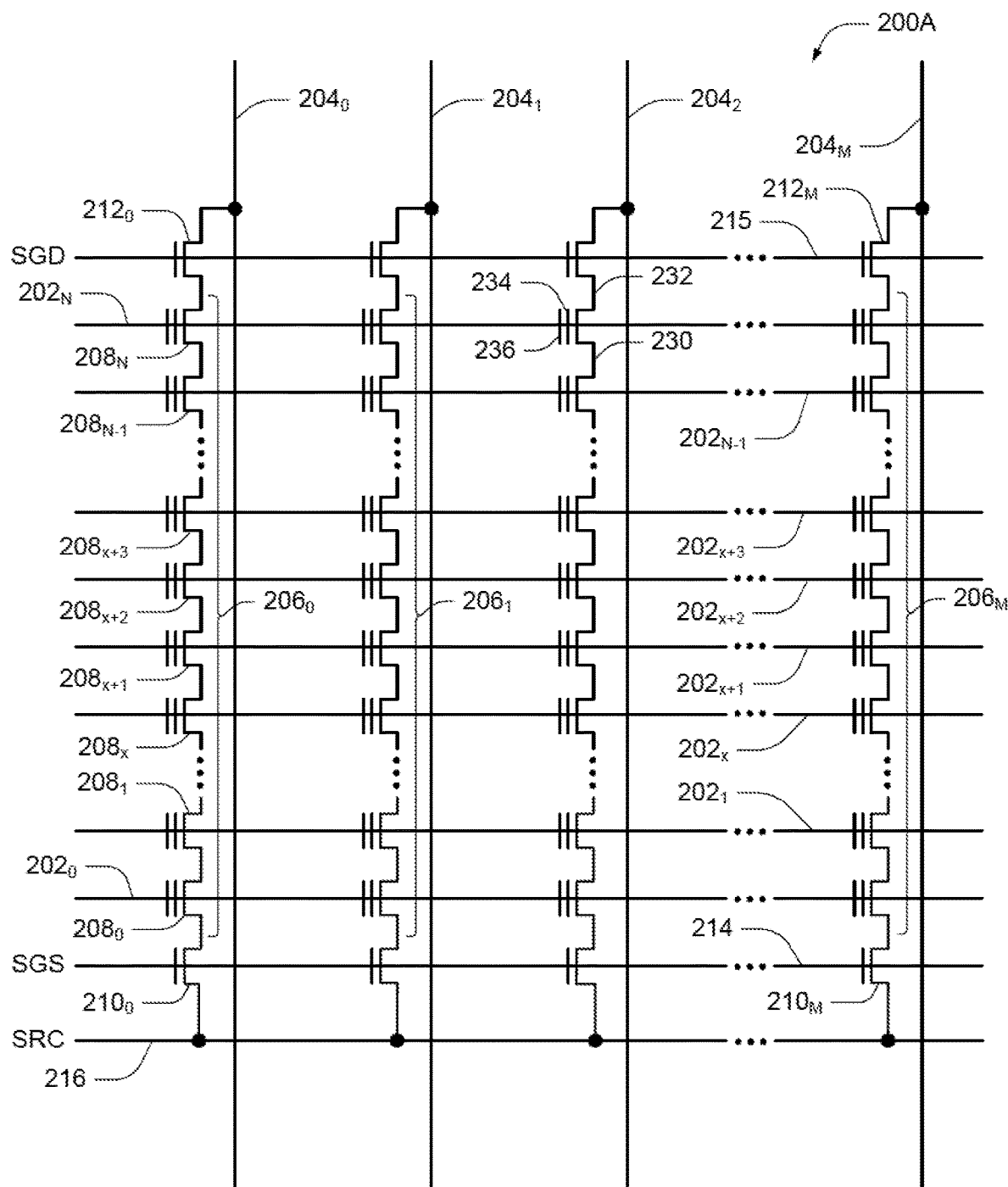
FIGS. 2A-2B are schematics of portions of an array of non-volatile memory cells as could be used in a memory of the type described with reference to FIG. 1A.

FIG. 2A is a schematic of a portion of an array of non-volatile memory cells 200A as could be used in a memory of the type described with reference to FIG. 1A, e.g., as a portion of array of memory cells 104, e.g., an array of non-volatile memory cells. The array of non-volatile memory cells 200A includes access lines, such as word lines $202_0$ to $202_N$, and data lines, such as bit lines $204_0$-$204_M$. The word lines 202 may be connected to global access lines (e.g., global word lines), not shown in FIG. 2A, in a many-to-one relationship. For some embodiments, the array of non-volatile memory cells 200A may be formed over a semiconductor that, for example, may be conductively doped to have a conductivity type, such as a p-type conductivity, e.g., to form a p-well, or an n-type conductivity, e.g., to form an n-well.

The array of non-volatile memory cells 200A might be arranged in rows (each corresponding to a word line 202) and columns (each corresponding to a bit line 204). Each column may include a string of series-connected memory cells, such as one of NAND strings $206_0$ to $206_M$. Each NAND string 206 might be connected (e.g., selectively connected) to a common source 216 and might include memory cells $208_0$ to $208_N$. The memory cells 208 may represent non-volatile memory cells for storage of data. The memory cells 208 of each NAND string 206 might be connected in series between a select gate 210 (e.g., a field-effect transistor), such as one of the select gates $210_0$ to $210_M$ (e.g., that may be source select transistors, commonly referred to as select gate source), and a select gate 212 (e.g., a field-effect transistor), such as one of the select gates $212_0$ to $212_M$ (e.g., that may be drain select transistors, commonly referred to as select gate drain). Select gates $210_0$ to $210_M$ might be commonly connected to a select line 214, such as a source select line, and select gates $212_0$ to $212_M$ might be commonly connected to a select line 215, such as a drain select line. Although depicted as traditional field-effect transistors, the select gates 210 and 212 may utilize a structure similar to (e.g., the same as) the memory cells 208. The select gates 210 and 212 might represent a plurality of select gates connected in series, with each select gate in series configured to receive a same or independent control signal.

A source of each select gate 210 might be connected to common source 216. The drain of each select gate 210 might be connected to a memory cell $208_0$ of the corresponding NAND string 206. For example, the drain of select gate $210_0$ might be connected to memory cell $208_0$ of the corresponding NAND string $206_0$. Therefore, each select gate 210 might be configured to selectively connect a corresponding NAND string 206 to common source 216. A control gate of each select gate 210 might be connected to select line 214.

The drain of each select gate 212 might be connected to the bit line 204 for the corresponding NAND string 206. For example, the drain of select gate $212_0$ might be connected to the bit line $204_0$ for the corresponding NAND string $206_0$. The source of each select gate 212 might be connected to a memory cell $208_N$ of the corresponding NAND string 206. For example, the source of select gate $212_0$ might be connected to memory cell $208_N$ of the corresponding NAND string $206_0$. Therefore, each select gate 212 might be configured to selectively connect a corresponding NAND string 206 to the common bit line 204. A control gate of each select gate 212 might be connected to select line 215.

The array of non-volatile memory cells in FIG. 2A might be a three-dimensional array of non-volatile memory cells, e.g., where NAND strings 206 may extend substantially perpendicular to a plane containing the common source 216 and to a plane containing a plurality of bit lines 204 that may be substantially parallel to the plane containing the common source 216.

Typical construction of memory cells 208 includes a data-storage structure 234 (e.g., a floating gate, charge trap, etc.) that can determine a data state of the memory cell (e.g., through changes in threshold voltage), and a control gate 236, as shown in FIG. 2A. The data-storage structure 234 may include both conductive and dielectric structures while the control gate 236 is generally formed of one or more conductive materials. In some cases, memory cells 208 may further have a defined source 230 and a defined drain 232. Memory cells 208 have their control gates 236 connected to (and in some cases form) a word line 202.

A column of the memory cells 208 may be a NAND string 206 or a plurality of NAND strings 206 selectively connected to a given bit line 204. A row of the memory cells 208 may be memory cells 208 commonly connected to a given word line 202. A row of memory cells 208 can, but need not, include all memory cells 208 commonly connected to a given word line 202. Rows of memory cells 208 may often be divided into one or more groups of physical pages of memory cells 208, and physical pages of memory cells 208 often include every other memory cell 208 commonly connected to a given word line 202. For example, memory cells 208 commonly connected to word line $202_N$ and selectively connected to even bit lines 204 (e.g., bit lines $204_0$, $204_2$, $204_4$, etc.) may be one physical page of memory cells 208 (e.g., even memory cells) while memory cells 208 commonly connected to word line $202_N$ and selectively connected to odd bit lines 204 (e.g., bit lines $204_1$, $204_3$, $204_5$, etc.) may be another physical page of memory cells 208 (e.g., odd memory cells). Although bit lines $204_3$-$204_5$ are not explicitly depicted in FIG. 2A, it is apparent from the figure that the bit lines 204 of the array of memory cells 200A may be numbered consecutively from bit line $204_0$ to bit line $204_M$. Other groupings of memory cells 208 commonly connected to a given word line 202 may also define a physical page of memory cells 208. For certain memory devices, all memory cells commonly connected to a given word line might be deemed a physical page of memory cells. The portion of a physical page of memory cells (which, in some embodiments, could still be the entire row) that is read during a single read operation or programmed during a single programming operation (e.g., an upper or lower page of memory cells) might be deemed a logical page of memory cells. A block of memory cells may include those memory cells that are configured to be erased together, such as all memory cells connected to word lines $202_0$-$202_N$ (e.g., all NAND strings 206 sharing common word lines 202). For example, an elevated voltage (e.g., 25V) might be applied to the bit lines 204 and the source 216 while a reference voltage (e.g., Vss or ground) is applied to the word lines 202 to remove charge from the memory cells 208. Unless expressly distinguished, a reference to a page of memory cells herein refers to the memory cells of a logical page of memory cells.

Figure 2B:
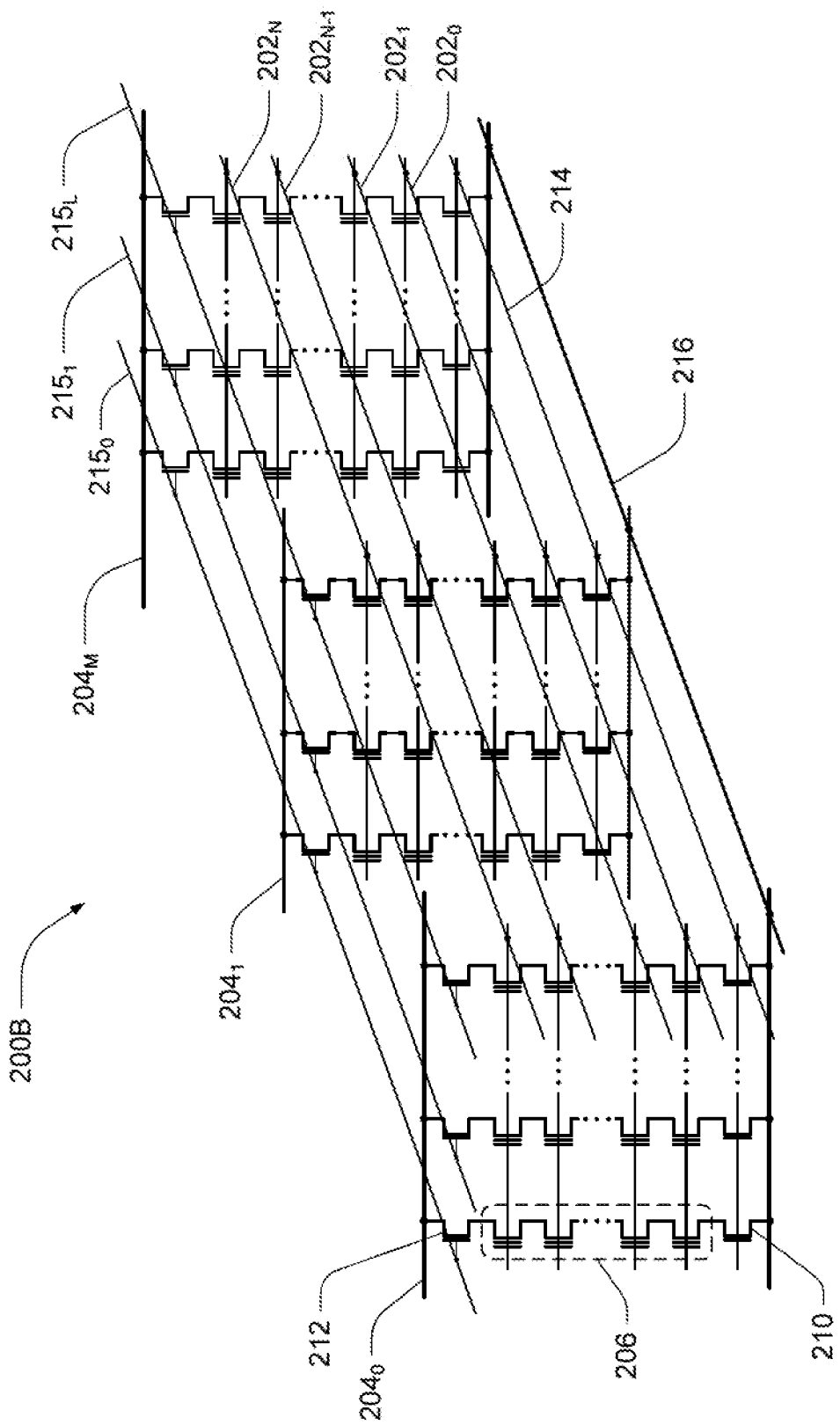

FIG. 2B is another schematic of a portion of an array of non-volatile memory cells 200B as could be used in a memory of the type described with reference to FIG. 1A, e.g., as a portion of array of memory cells 104, e.g., an array of non-volatile memory cells. Like numbered elements in FIG. 2B correspond to the description as provided with respect to FIG. 2A. FIG. 2B provides additional detail of one example of a three-dimensional NAND memory array structure. The three-dimensional NAND array of non-volatile memory cells 200B may incorporate vertical structures which may include semiconductor pillars where a portion of a pillar may act as a channel region of the memory cells of NAND strings 206. The NAND strings 206 may be each selectively connected to a bit line $204_0$-$204_M$ by a select transistor 212 (e.g., that may be drain select transistors, commonly referred to as select gate drain) and to a common source 216 by a select transistor 210 (e.g., that may be source select transistors, commonly referred to as select gate source). Multiple NAND strings 206 might be selectively connected to the same bit line 204. Subsets of NAND strings 206 can be connected to their respective bit lines 204 by biasing the select lines $215_0$-$215_L$ to selectively activate particular select transistors 212 each between a NAND string 206 and a bit line 204. The select transistors 210 can be activated by biasing the select line 214. Each word line 202 may be connected to multiple rows of memory cells of the array of non-volatile memory cells 200B. Rows of memory cells that are commonly connected to each other by a particular word line 202 may collectively be referred to as tiers.

Figure 2C:
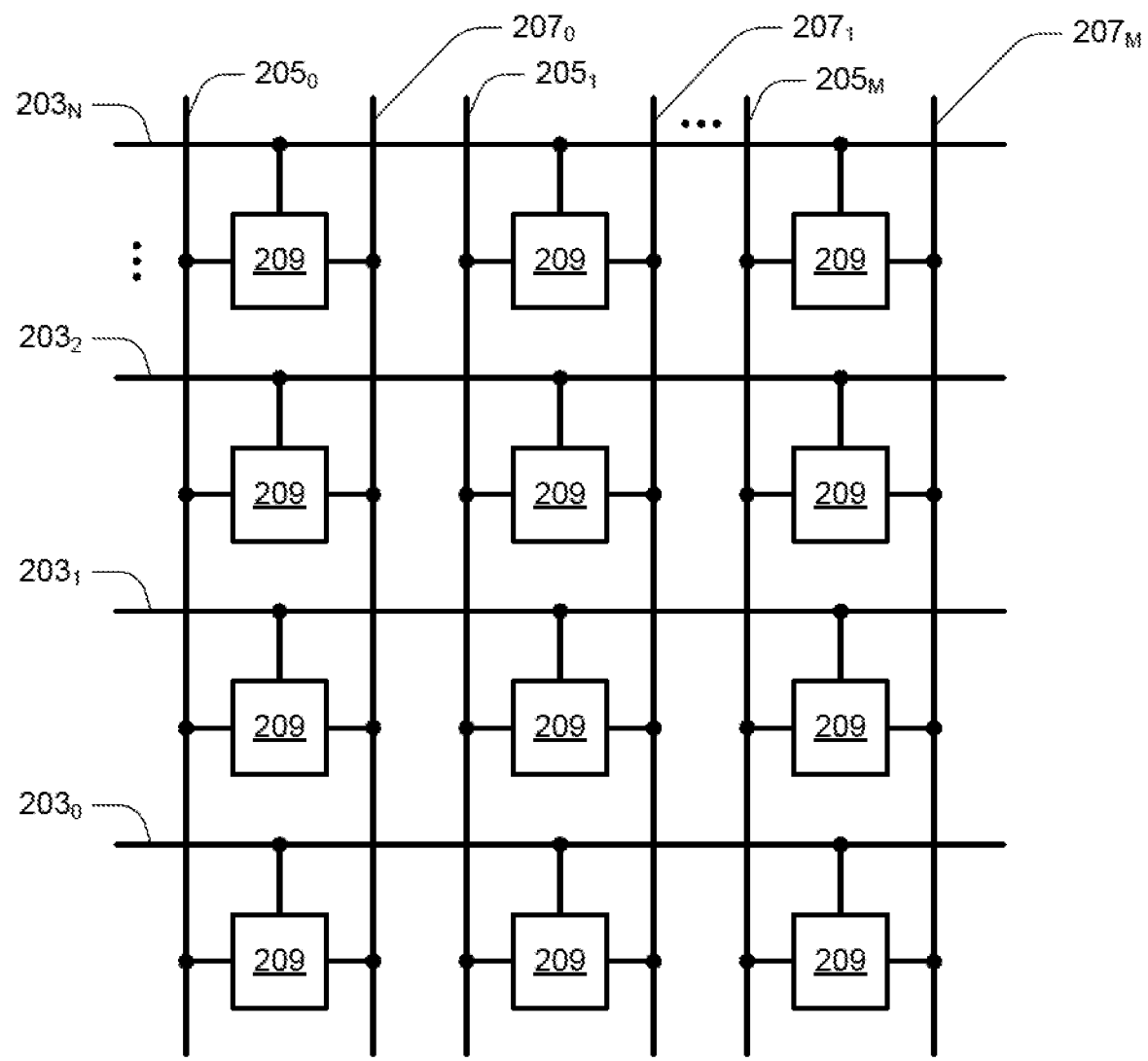
FIG. 2C is a block schematic of a portion of an array of volatile memory cells as could be used in a memory of the type described with reference to FIG. 1A.

FIG. 2C is a block schematic of a portion of an array of volatile memory cells 200C as could be used in a memory of the type described with reference to FIG. 1A, e.g., as a portion of array of memory cells 104, e.g., an array of volatile memory cells. The array of volatile memory cells 200C includes access lines, such as word lines 2030 to 203N, and pairs of complementary data lines, such as data lines 2050-205M and data bar lines 2070-207M. The word lines 203 may be connected to global access lines (e.g., global word lines), not shown in FIG. 2C, in a many-to-one relationship. For some embodiments, the array of volatile memory cells 200C may be formed over a semiconductor that, for example, may be conductively doped to have a conductivity type, such as a p-type conductivity, e.g., to form a p-well, or an n-type conductivity, e.g., to form an n-well.

The array of volatile memory cells 200C might be arranged in rows (each corresponding to a word line 203) and columns (each corresponding to a pair of complementary data lines 205 and 207). The memory cells 209 may represent SRAM memory cells for storage of data.

Figure 2D:
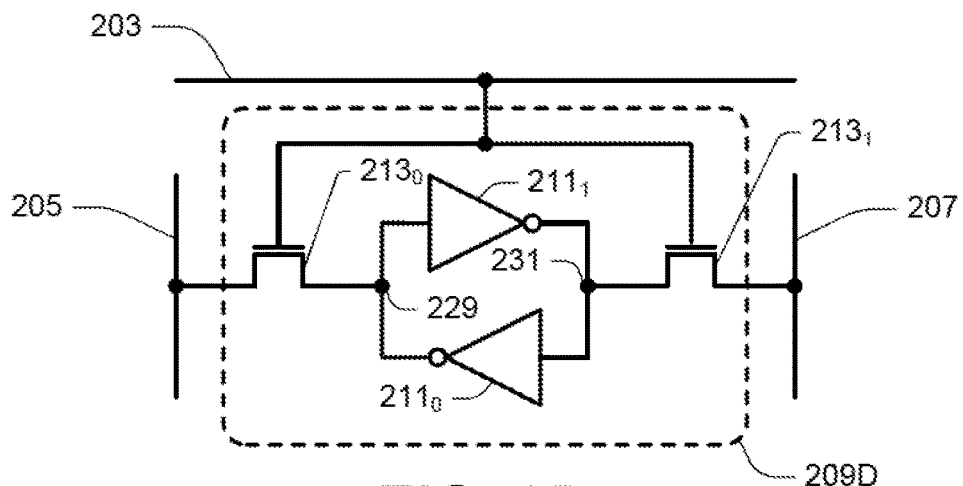
FIG. 2D is a block schematic of an SRAM memory cell as could be used in an array of volatile memory cells of the type described with reference to FIG. 2C.

FIG. 2D is a block schematic of an SRAM memory cell 209D as could be used in an array of volatile memory cells of the type described with reference to FIG. 2C. While a variety of SRAM memory cell designs are known, many simplify down to a pair of cross-coupled inverters $211_0$ and $211_1$ collectively forming a latch having one data node 229 selectively connected to the data line 205 through a field-effect transistor (FET) $213_0$, and another data node (e.g., data bar node) 231 selectively connected to the data bar line 207 through a field-effect transistor (FET) $213_1$. The data nodes 229 and 231 may generally have complementary logic levels.

The FETs $213_0$ and $213_1$ each might have their control gates connected to the word line 203. Reading and programming the memory cell 209D may be performed by applying appropriate voltage signals to the word line 203, data line 205 and data bar line 207. For example, by applying a voltage signal to the word line 203 sufficient to activate the FETs 213, the data value of the memory cell 209D, and its complement, could be determined by sensing a voltage level developed on the data line 205 and data bar line 207, respectively. Similarly, by applying a voltage signal to the word line 203 sufficient to activate the FETs 213, a data value may be programmed to (e.g., written to) the memory cell 209D by applying complementary voltage signals to the data line 205 and the data bar line 207, e.g., a logic high level on the data line 205 and a logic low level on the data bar line 207 to program one data value, e.g., a logic high level of the data node 229, and a logic low level on the data line 205 and a logic high level on the data bar line 207 to program a different data value, e.g., a logic low level of the data node 229.

Figure 2E:
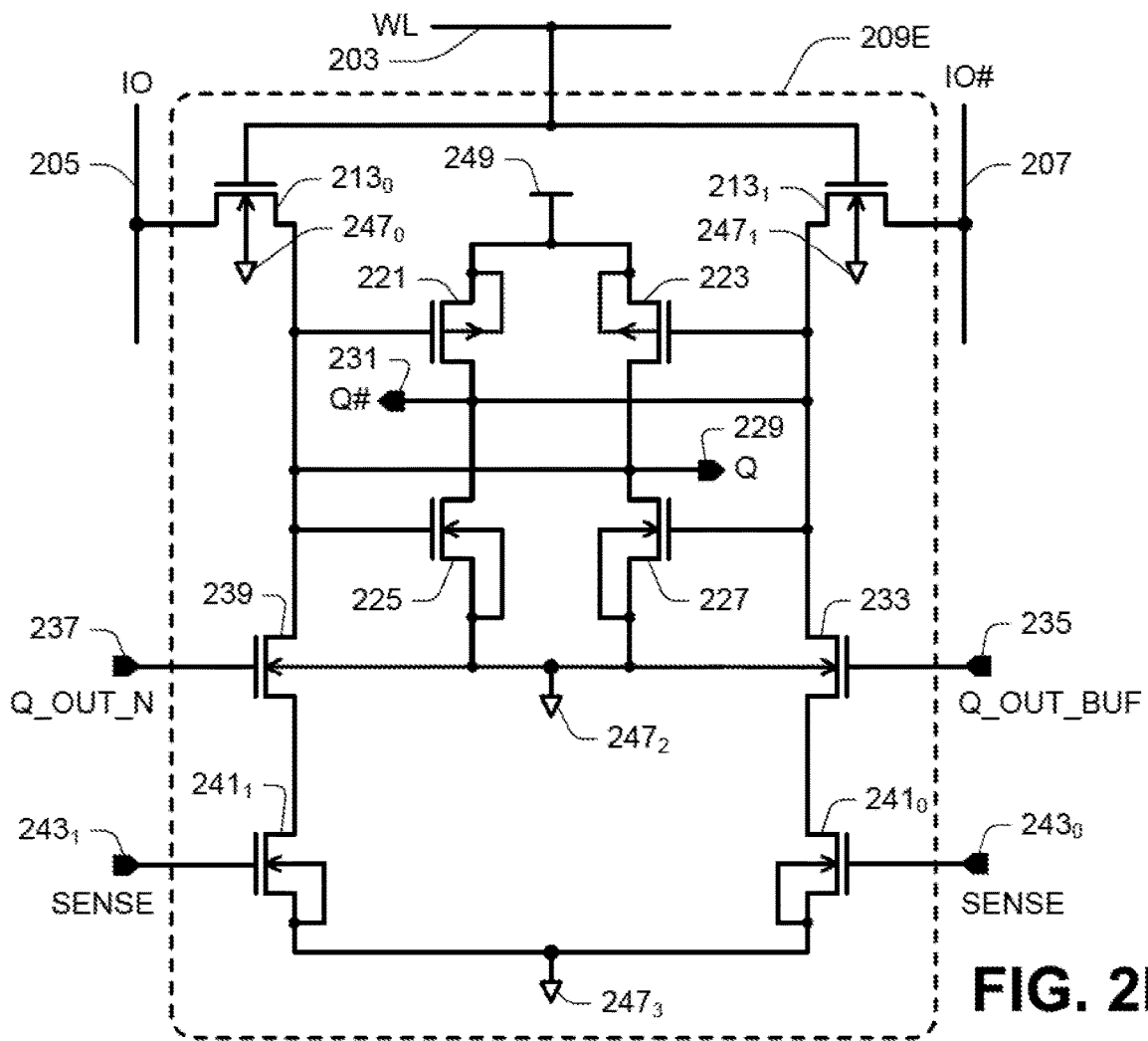
FIG. 2E is another schematic of an SRAM memory cell in accordance with an embodiment as could be used in an array of volatile memory cells of the type described with reference to FIG. 2C.

FIG. 2E is another schematic of an SRAM memory cell 209E as could be used in an array of volatile memory cells of the type described with reference to FIG. 2C. The memory cell 209E might include an n-type FET (nFET) $213_0$ having a control gate connected to the word line 203 (WL) and a first source/drain connected to the data line 205 (IO), and an nFET $213_1$ having a control gate connected to the word line 203 and a first source/drain connected to the data bar line 207 (IO #). The nFETs $213_0$ and $213_1$ may have their bodies connected to voltage nodes $247_0$ and $247_1$, respectively, such as a reference voltage nodes configured to receive a reference voltage such as Vss, ground or 0V, for example. The voltage nodes $247_0$ and $247_1$ may each be connected to receive a same reference voltage.

The memory cell 209E may further include a p-type FET (pFET) 223 and an nFET 227 connected in series between a voltage node 249 and a voltage node $247_2$. The voltage node 249 may be configured to receive a supply voltage, such as Vcc or other voltage greater than the voltage level of the voltage node $247_2$. The voltage node $247_2$ may be configured to receive a reference voltage such as Vss, ground or 0V, for example. The voltage node $247_2$ may be connected to receive a same reference voltage as the voltage nodes $247_0$ and $247_1$. The pFET 223 may have its body connected to the voltage node 249. The nFET 227 may have its body connected to the voltage node $247_2$. The control gates of the pFET 223 and the nFET 227 may be connected to a second source/drain of the nFET $213_1$. The pFET 223 and the nFET 227 may collectively form the inverter $211_0$ of FIG. 2D.

The memory cell 209E may further include a pFET 221 and an nFET 225 connected in series between the voltage node 249 and the voltage node $247_2$. The pFET 221 may have its body connected to the voltage node 249. The nFET 225 may have its body connected to the voltage node $247_2$. The control gates of the pFET 221 and the nFET 225 may be connected to a second source/drain of the nFET $213_0$. The pFET 221 and the nFET 225 may collectively form the inverter $211_1$ of FIG. 2D. The data node 229 may be connected between the pFET 223 and the nFET 227, connected to the control gates of the pFET 221 and the nFET 225, and connected to the second source/drain of the nFET $213_0$. The data node 231 may be connected between the pFET 221 and the nFET 225, connected to the control gates of the pFET 223 and the nFET 227, and connected to the second source/drain of the nFET $213_1$.

The memory cell 209E may further include an nFET 233 having a first source/drain connected to the second source/drain of the nFET $213_1$ and a control gate connected to a control signal node 235 (Q_OUT_BUF), and an nFET 239 having a first source/drain connected to the second source/drain of the nFET $213_0$ and a control gate connected to a control signal node 237 (Q_OUT_N). The bodies of the nFETs 233 and 239 may be connected to the voltage node $247_2$.

The memory cell 209E may further include an nFET $241_0$ having a first source/drain connected to a second source/drain of the nFET 233, a second source/drain connected to a voltage node $247_3$, and a control gate connected to a control signal node $243_o$ (SENSE), and an nFET $241_1$ having a first source/drain connected to a second source/drain of the nFET 239, a second source/drain connected to the voltage node $247_3$, and a control gate connected to a control signal node $243_1$ (SENSE). The control signal nodes $243_0$ and $243_1$ may be configured to receive a same control signal, e.g., indicative of a desire to write data to the memory cell 209E, e.g., from a sensed differential storage device. The bodies of the nFETs $243_0$ and $243_1$ may be connected to the voltage node $247_3$. The voltage node $247_3$ may be configured to receive a reference voltage such as Vss, ground or 0V, for example. The voltage node $247_3$ may be connected to receive a same reference voltage as the voltage nodes $247_0$, $247_1$ and $247_2$. While the nFETs $241_0$ and $241_1$ are depicted as two separate transistors, they could be replaced by a single nFET having a first source/drain connected to the second source/drain of the nFET 233 and to the second source/drain of the nFET 239, and having a second source/drain connected to the voltage node $247_3$.

The control signal nodes 235 and 237 might be configured to receive complementary control signals indicative of a data state to store to the memory cell 209E. For example, if the control signal nodes $243_0$ and $243_1$ receive a control signal having a logic high level, thus activating the nFETs $241_0$ and $241_1$, the control signal node 237 receives a control signal having a logic low level, and the control signal node 235 receives a control signal having the logic high level, a data state corresponding to a logic high level on the data node 229 (Q) and a logic low level of the data bar node 231 (Q #) may be stored to the memory cell 209E. Conversely, if the control signal nodes $243_0$ and $243_1$ receive a control signal having the logic high level, thus activating the nFETs $241_0$ and $241_1$, the control signal node 237 receives a control signal having the logic high level, and the control signal node 235 receives a control signal having the logic low level, a data state corresponding to a logic low level on the data node 229 (Q) and a logic high level of the data bar node 231 (Q #) may be stored to the memory cell 209E.

Figure 3A:
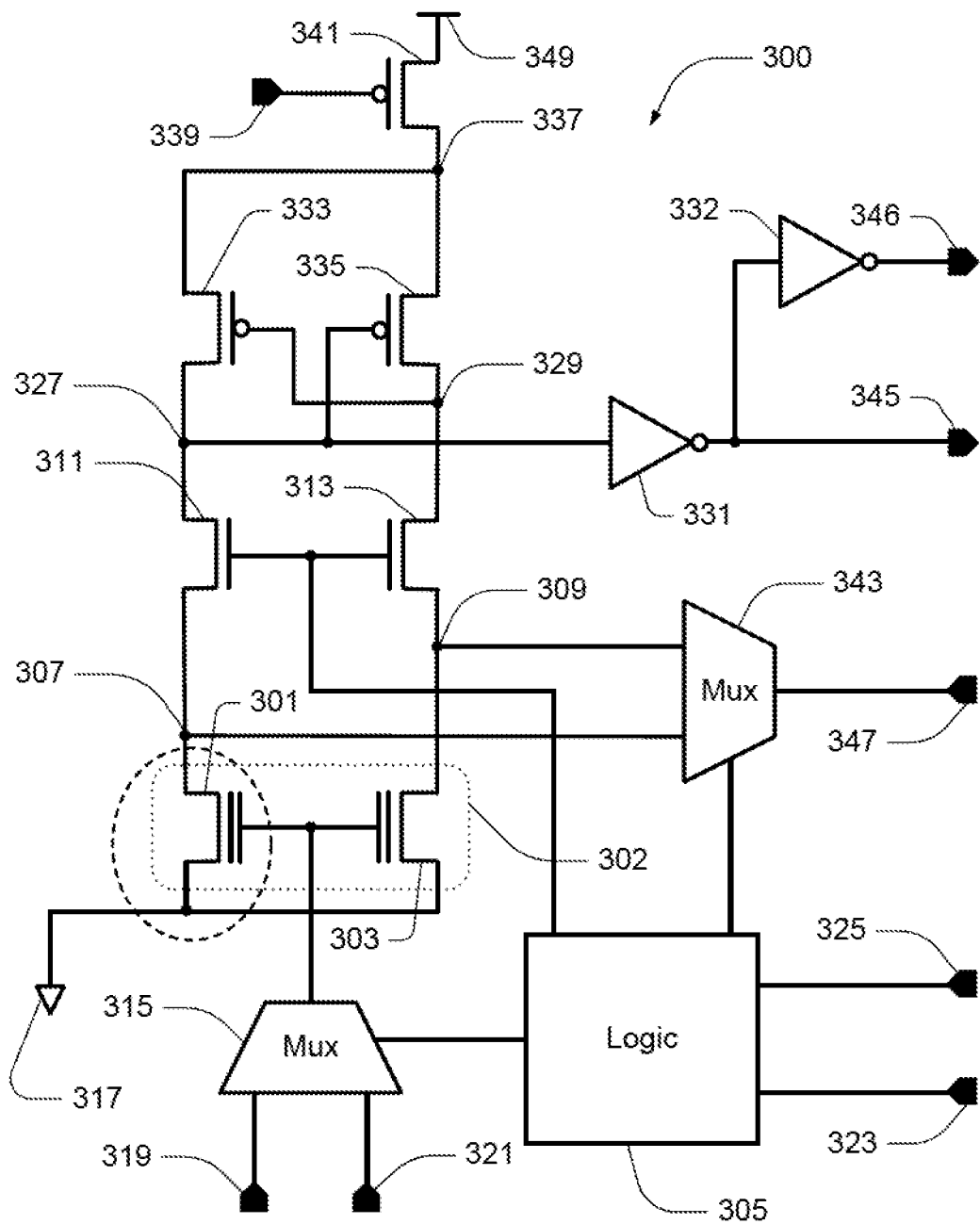
FIG. 3A is a schematic of a differential storage device 300 in accordance with an embodiment.

FIG. 3A is a schematic of a differential storage device 300 in accordance with an embodiment. The differential storage may include a first non-volatile memory cell 301 and a second non-volatile memory cell 303 connected in parallel. Each of the non-volatile memory cells 301/303 may have a structure of the type described with reference to the memory cells 208 of FIG. 2A, e.g., each non-volatile memory cell 301/303 may include a field-effect transistor (e.g., an n-type field effect transistor or nFET) having a data-storage structure that can determine a data state of that memory cell through changes in threshold voltage. The gate (e.g., control gate) of the non-volatile memory cell 301 may be connected to the gate (e.g., control gate) of the non-volatile memory cell 303. The non-volatile memory cell 301 may be connected in series between a node 307 and a voltage node 317, such as a reference voltage node configured to receive a reference voltage such as Vss, ground or 0V, for example. The non-volatile memory cell 303 may be connected in series between a node 309 and the voltage node 317. For example, the non-volatile memory cell 301 may have a first source/drain connected to the voltage node 317 and a second source/drain connected to the node 307, while the non-volatile memory cell 303 may have a first source/drain connected to the voltage node 317 and a second source/drain connected to the node 309. The differential storage device 300 may facilitate storing a digit (e.g., bit) of data determined in response to a difference in current flow through each of the non-volatile memory cells 301/303 of the pair of gate-connected non-volatile memory cells.

The differential storage device 300 may further include an isolation gate (e.g., nFET) 311 having a first source/drain connected to the node 307 and a second source/drain connected to the node 327, and an isolation gate (e.g., nFET) 313 having a first source/drain connected to the node 309 and a second source/drain connected to the node 329. The gate (e.g., control gate) of the nFET 311 may be connected to the gate (e.g., control gate) of the nFET 313. The differential storage device 300 may further include a p-type field-effect transistor (pFET) 333 having a first source/drain connected to the node 327 and a second source/drain connected to the node 337, and a pFET 335 having a first source/drain connected to the node 329 and a second source/drain connected to the node 337. The gate (e.g., control gate) of the pFET 333 may be connected to the node 329 while the gate (e.g., control gate) of the pFET 335 may be connected to the node 327.

The differential storage device 300 may further include a pFET 341 having a first source/drain connected to the node 337 and a second source/drain connected to the voltage node 349. The voltage node 349 may be configured to receive a supply voltage, such as Vcc or other voltage greater than the voltage level of the voltage node 317. The supply voltage may be a voltage (e.g., one of the voltages) used to access the array of memory cells. The gate (e.g., control gate) of the pFET 341 may be connected to the control signal node 339.

The differential storage device 300 may further include a first output buffer, such as inverter 331. The inverter 331 has an input connected to the node 327, and an output connected to the first buffer output node 345. The differential storage device 300 may further include a second output buffer, such as inverter 332. The inverter 332 has an input connected to the first buffer output node 345, and an output connected to the second buffer output node 346.

The differential storage device 300 may further include a multiplexer 315 and a multiplexer 343. The multiplexer 315 may be connected to receive a plurality of voltage signals, such as voltage signals received from voltage signal nodes 319 and 321. The voltage signal node 319 may be configured to receive a first voltage, such as a read voltage, and the voltage signal node 321 may be configured to receive a second voltage, such as a program voltage. The output of the multiplexer 315 may be connected to the gates of the non-volatile memory cells 301 and 303. The multiplexer 343 may be configured to receive a voltage signal, such as a voltage signal from voltage signal node 347. The voltage signal node 347 may be configured to receive a voltage, e.g., a drain voltage configured to enable programming of one of the non-volatile memory cells 301 or 303 as described below.

The differential storage device 300 may further include logic 305 for access of the differential storage device 300.

The logic 305 may be responsive to a plurality of control signals, such as control signals received from control signal nodes 323 and 325. Control signal node 323 may be configured to receive one or more control signals indicative of a data value (e.g., a digit of data) of a memory cell. The data value of the memory cell may represent one page (e.g., one digit) of data of an MLC memory cell. For example, during programming of an upper page of data to a memory cell configured to store two pages of data, the data value of the lower page of data may be stored (e.g., in a cache register or other temporary storage location). The control signal node 323 may be configured to receive a control signal indicative of the data value of the lower page of data, and may further be configured to receive a control signal that is a complement of the control signal indicative of the data value of the lower page of data. Control signal node 325 may be configured to receive one or more control signals indicative of whether a power fail is indicated. For example, the control signal node 325 may be configured to receive a control signal indicative of whether a power fail is indicated, and may further be configured to receive a control signal that is a complement of the control signal indicative of whether a power fail is indicated. The logic 305 may further be responsive to one or more other control signals.

The multiplexer 315 may be responsive to one or more control signals from the logic 305 to select one of its input voltage signals to apply to the gates of the non-volatile memory cells 301 and 303. The multiplexer 343 may be responsive to one or more control signals from the logic 305 to apply its received voltage to a select one of the nodes 307 and 309 for application to the second source/drain of the non-volatile memory cell 301 or the second source/drain of the non-volatile memory cell 303, respectively. The logic 305 may further be configured to provide a control signal to the gates of the nFETs 311 and 313 to selectively activate nFETs 311 and 313, such as during a read operation on the differential storage device 300, or deactivate nFETs 311 and 313, such as during a programming operation on one of the non-volatile memory cells 301 or 303.

In the differential storage device 300, it can be seen that if the non-volatile memory cell 301 is unprogrammed (e.g., having a threshold voltage at an initial value) and the non-volatile memory cell 303 is programmed (e.g., having a threshold voltage greater than the initial value), the unprogrammed non-volatile memory cell 301 may be activated in response to a voltage level applied to its gate while the programmed non-volatile memory cell 303 may remain deactivated in response to that same voltage level. By activating the nFETs 311 and 313, and activating the pFET 341, current may flow through the non-volatile memory cell 301 while the non-volatile memory cell 303 may inhibit such current flow. As a result, the node 327 will have a logic low level, thus activating the pFET 335. This will bring node 329 to a logic high level, thus deactivating the pFET 333 and maintaining the node 327 at the logic low level. The first buffer output node 345 may have a logic high level and the second buffer output node 346 may have a logic low level as a result.

Conversely, if the non-volatile memory cell 301 is programmed and the non-volatile memory cell 303 is unprogrammed, activating the nFETs 311 and 313, and activating the pFET 341, may result in current flow through the non-volatile memory cell 303 while the non-volatile memory cell 301 may inhibit such current flow. As a result, the node 329 will have a logic low level, thus activating the pFET 33. This will bring node 327 to a logic high level, thus deactivating the pFET 333 and maintaining the node 327 at the logic high level. The first buffer output node 345 may have a logic low level and the second buffer output node 346 may have a logic high level as a result.

To program the differential storage device 300, the nFETs 311 and 313 may be deactivated to isolate the non-volatile memory cells 301 and 303 from the pFETs 333 and 335. The voltage level of the voltage signal node 321 may be applied to the gates of both non-volatile memory cells 301 and 303, while the voltage level of the voltage signal node 347 may be applied to the second source/drain of the non-volatile memory cell 301 or 303 selected for programming. As one example, the voltage level of the voltage signal node 321 may be about 15V while the voltage level of the voltage signal node 347 may be about 5V. In this manner, the non-volatile memory cells 301 and 303 would both be activated, the non-volatile memory cell 301 or 303 receiving the voltage level of the voltage signal node 321 at its second source/drain (e.g., at node 307 or 309, respectively) would be conducting current to the voltage node 317 and charge carriers (e.g., electrons) could tunnel or otherwise be injected into the data-storage node of that non-volatile memory cell. The remaining non-volatile memory cell 301 or 303 would have its second source/drain connected to the voltage node 317, and may not experience an increase of electrons in its data-storage node, such that it would remain in its initial (e.g., erased) state. However, even if this non-volatile memory cell experienced some tunneling effect, it would be expected to be less than that of the non-volatile memory cell selected for programming. Due to the differential nature of the differential storage device, this difference in threshold voltage could still be exploited to distinguish the stored data value. A non-volatile memory cell 301 or 303 that is not selected for programming, and that experiences such incidental accumulation of charge in its data-storage structure, will still be deemed an unprogrammed memory cell.

The non-volatile memory cells 301 and 303 might optionally be formed in an isolated well structure 302, e.g., a semiconductor structure isolated from bodies of remaining transistors of the differential storage device 300. In this manner, the bodies of the non-volatile memory cells 301 and 303 might be biased at an erase voltage, e.g., 20V, while the control gates of the non-volatile memory cells 301 and 303 are biased at a lower voltage expected to remove charge from data-storage structures of the non-volatile memory cells 301 and 303, e.g., Vss. This could facilitate erasure of the non-volatile memory cells 301 and 303 while mitigating detrimental effect on remaining components of the differential storage device 300.

Figure 3B:
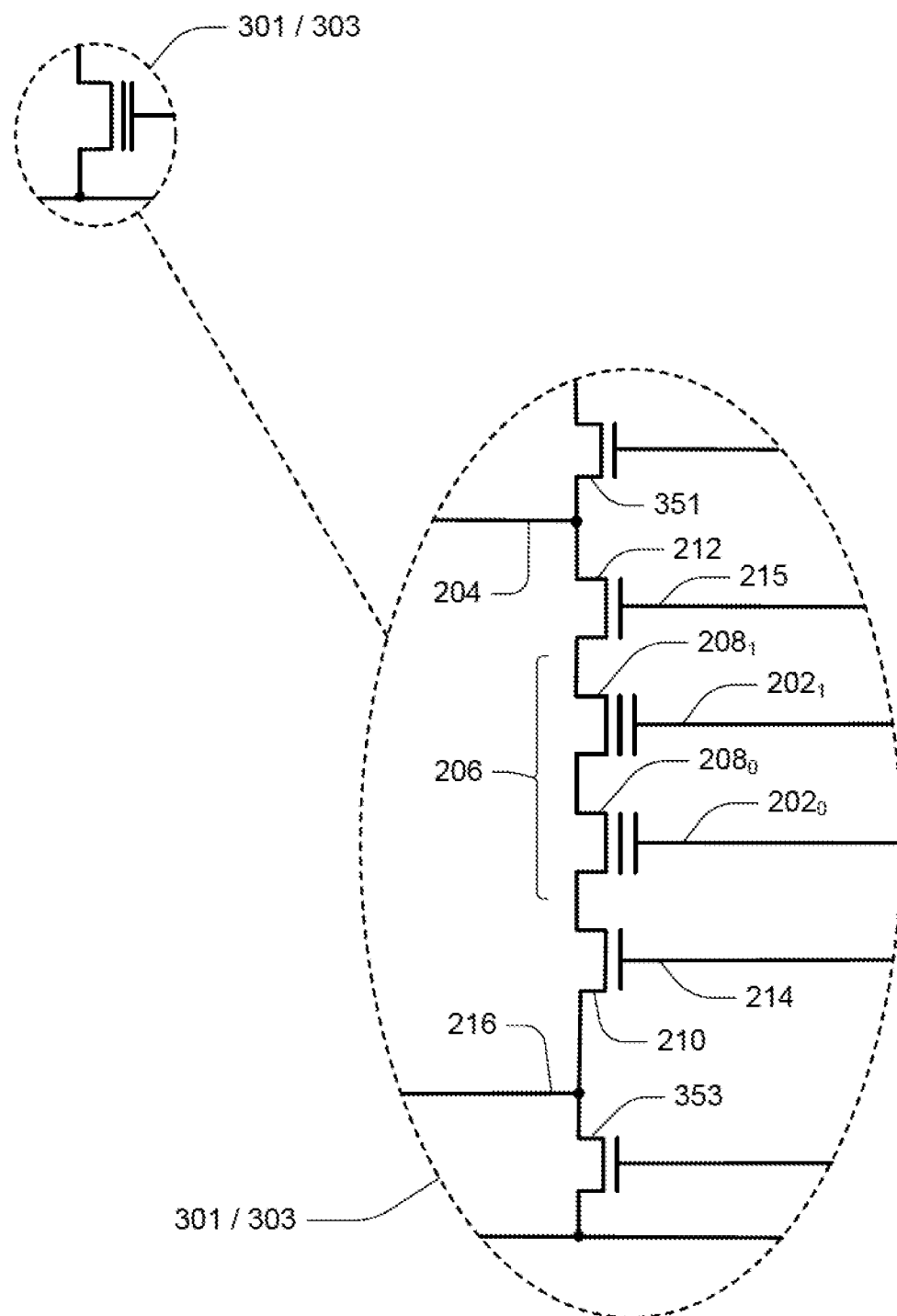
FIG. 3B is a schematic of an alternate structure that could be used as a non-volatile memory cell of a differential storage device in accordance with an embodiment.

Although the non-volatile memory cells 301 and 303 of the differential storage device 300 are depicted as distinct devices, embodiments may utilize structures similar to (e.g., the same as) the NAND strings shown in FIG. 2A. FIG. 3B is a schematic of an alternate structure that could be used as a non-volatile memory cell 301 or 303 of the differential storage device 300 in accordance with an embodiment. As shown in FIG. 3B, the non-volatile memory cell 301 or 303 may be represented as a NAND string 206. In addition, although depicted in FIG. 3B as a NAND string 206 having two memory cells 208 in series, the NAND string 206 could be modified to include only one memory cell 208 between the select gates 210 and 212, or it could include additional memory cells 208 in series. For embodiments using NAND strings 206 having more than one memory cell 208, the output of the multiplexer 315 might be applied to only one of the word lines 202, or it might be applied to more than one, and possibly all, of the word lines 202 such that multiple memory cells 208 in series may act as a single non-volatile memory cell 301 or 303.

By incorporating isolation gates (e.g., nFETs) 351 and 353, the NAND string 206 could be isolated from remaining circuitry of the differential storage device 300. As a result, the non-volatile memory cell 301 or 303 could be erased using the same mechanisms discussed with respect to FIG. 2A. The logic 305 could be modified accordingly to activate the nFETs 351 and 353 whenever access to the non-volatile memory cells 301 or 303 is desired.

Figure 4:
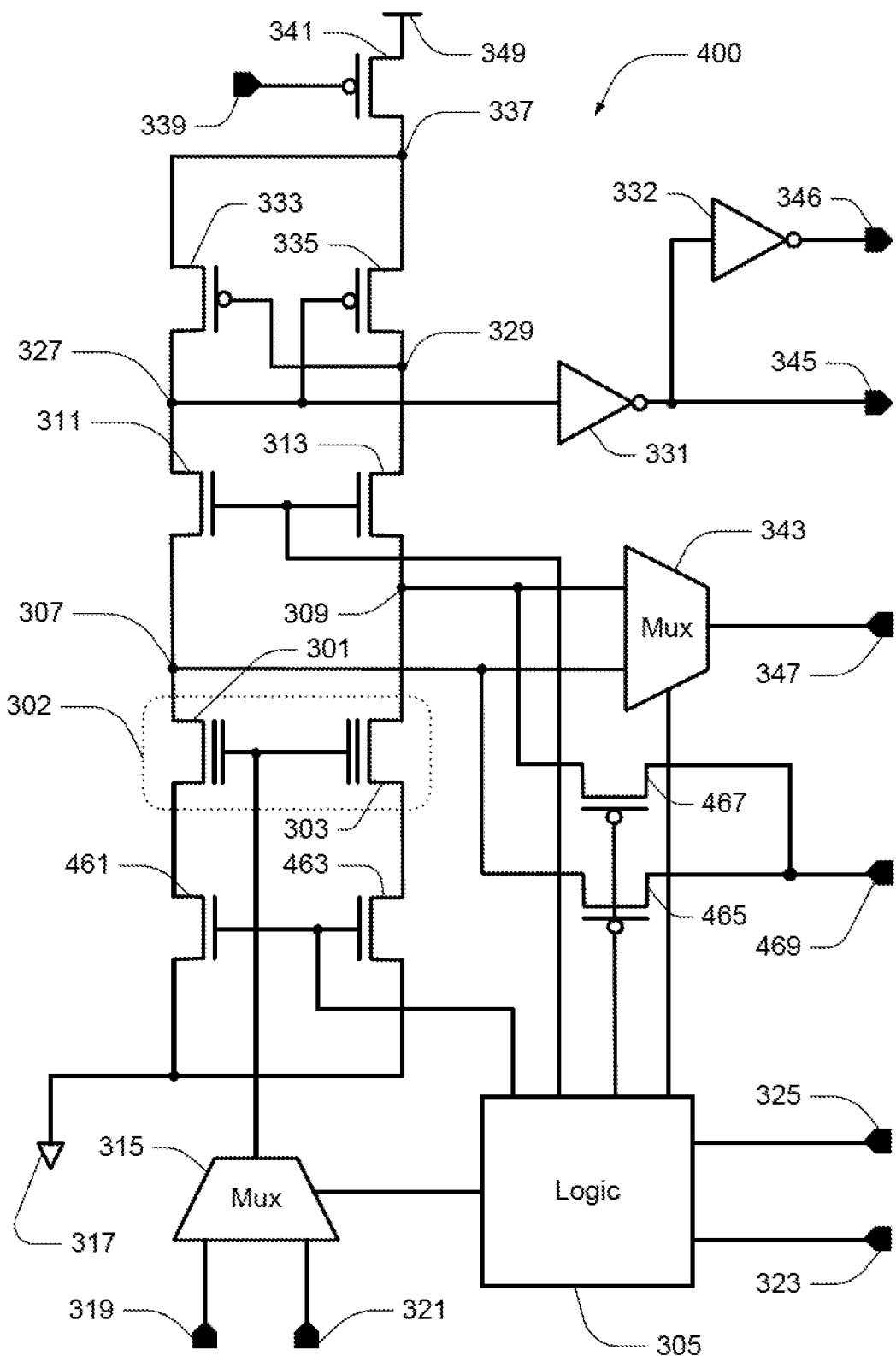
FIG. 4 is a schematic of a differential storage device 400 in accordance with another embodiment.

FIG. 4 is a schematic of a differential storage device 400 in accordance with another embodiment. The differential storage device 400 may differ from the differential storage device 300 in the addition of isolation gates (e.g., nFETs) 461 and 463, and pFETs 465 and 467. The nFET 461 is connected in series between the non-volatile memory cell 301 and the voltage node 317, while the nFET 463 is connected in series between the non-volatile memory cell 303 and the voltage node 317. The nFETs 461 and 463 have their gates (e.g., control gates) connected together, and are responsive to control signals from the logic 305. The pFET 465 has a first source/drain connected to the node 307 and a second source/drain connected to the voltage signal node 469. The pFET 467 has a first source/drain connected to the node 309 and a second source/drain connected to the voltage signal node 469. The pFETs 465 and 467 have their gates (e.g., control gates) connected together, and are responsive to control signals from the logic 305. The voltage signal node 469 may be configured to receive an erase voltage. For example, the erase voltage may be some voltage level that is higher than the voltage level of the voltage signal node 319 that when both are applied to nodes 307/309 and the gates of the non-volatile memory cells 301/303, respectively, and the nFETs 461 and 463 are deactivated (e.g., to float the remaining source/drain of each non-volatile memory cell 301/303), the voltage drop from the channel of the non-volatile memory cells 301/303 to the gates of the non-volatile memory cells 301/303 is sufficient to remove charge from the data-storage structure of the non-volatile memory cells 301/303.

Alternatively, the erase voltage could be applied (e.g., selectively applied) to the voltage signal node 347 such that the multiplexer 343 could be used to selectively apply the erase voltage to a single node 307 or 309 to erase only the non-volatile memory cell 303 or 303 that had previously been programmed. This might be useful in mitigating any issues of over erasing a memory cell. Note that during an erase operation on the differential storage device 400, the nFETs 311 and 313 may also be deactivated. Additionally, the multiplexer 315 might be configured to have a third input connected to the voltage node 317, such that a reference voltage (e.g., Vss, ground or 0V) could be applied to the gates of the non-volatile memory cells 301 and 303, which might facilitate a reduction in the voltage level of the erase voltage relative to using the voltage level of the voltage signal node 319.

Figure 5:
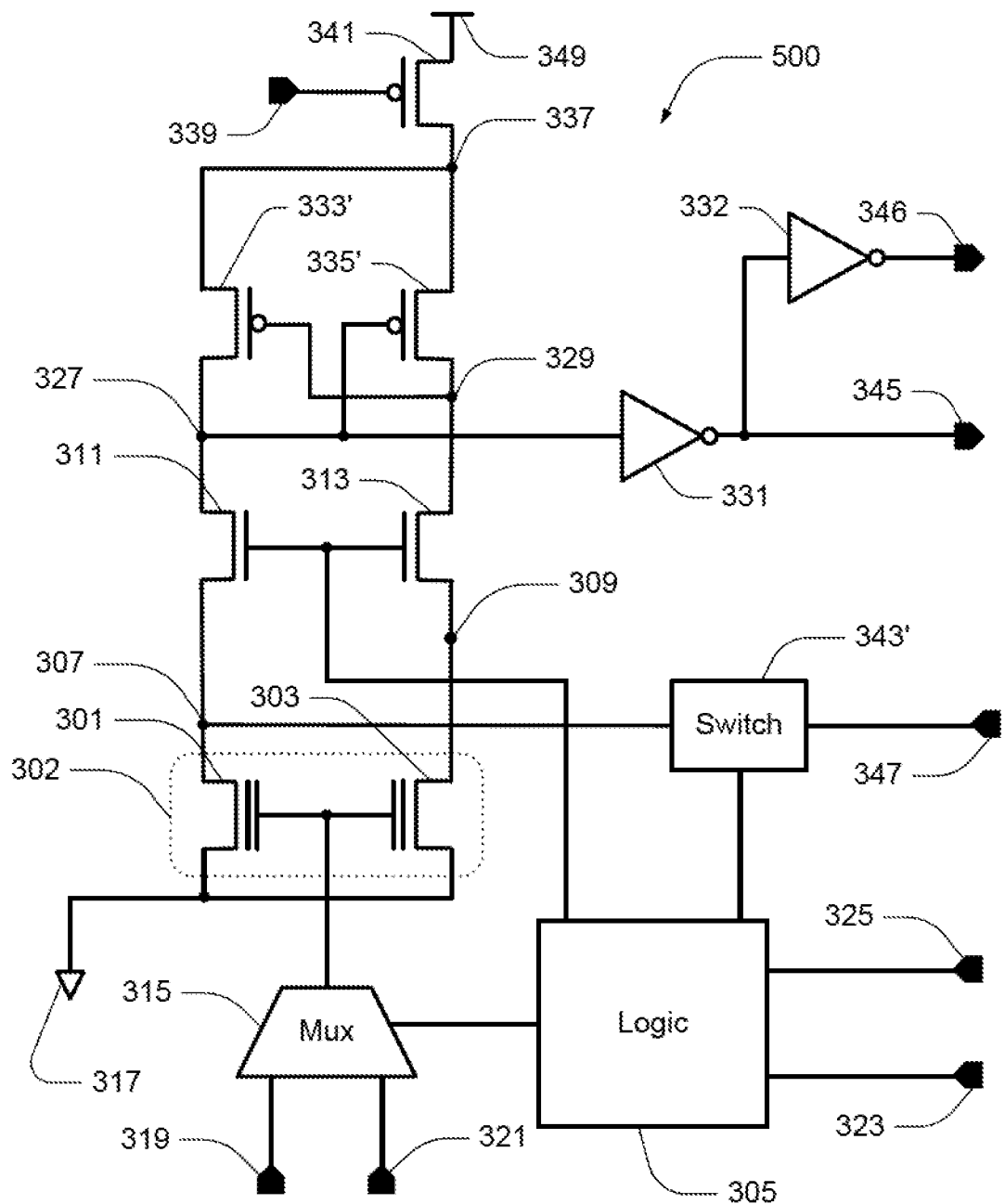
FIG. 5 is a schematic of a differential storage device 400 in accordance with a further embodiment.

Various embodiments may be configured to initiate programming of one of the non-volatile memory cells 301 or 303 only when the data value of the prior page data has a particular logic level. FIG. 5 is a schematic of a differential storage device 500 in accordance with a further embodiment. The differential storage device 500 may differ from the differential storage device 300 in the replacement of the multiplexer 343 with a switch 343' such that only one of the nodes 307 and 309 is selectively connected to the voltage signal node 347. In addition, the pFETs 333' and 335' may have differing W/L ratios or otherwise configured to have different conductance at a particular gate voltage. For the example of FIG. 5, the W/L ratio of the pFET 335' may be greater than the W/L ratio of the pFET 333', such that its conductance at a particular gate voltage is less than the conductance of the pFET 333'. In this manner, a default logic level of the node 327 may be a logic low level if both non-volatile memory cells 301 and 303 are unprogrammed, and a logic high level if the non-volatile memory cell 301 is programmed. Programming and erasing of the non-volatile memory cell 301 in this example can be performed as discussed with reference to FIGS. 3A, 3B and 4, with any apparent modifications in structure as discussed with reference to FIG. 3B or 4.

Figure 6A:
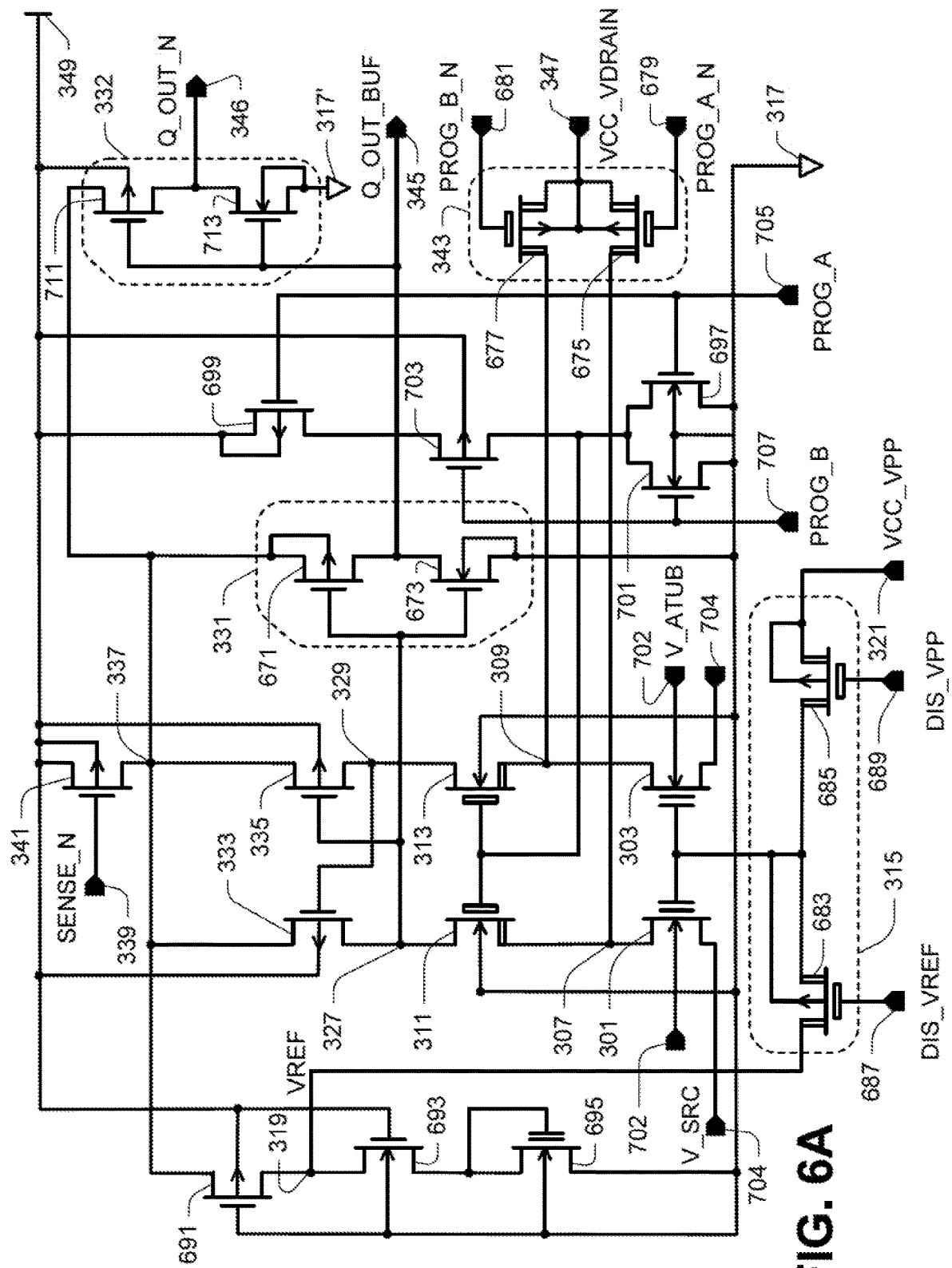
FIGS. 6A-6D collectively depict a schematic of a specific implementation of a differential storage device of the type described with reference to FIG. 3A.

FIGS. 6A-6D collectively depict a schematic of a specific implementation of a differential storage device of the type described with reference to FIG. 3A. As depicted in FIG. 6A, the nFETs 311 and 313 may be high-voltage nFETs sufficient to protect the pFETs 333 and 335 from the voltages utilized during programming and/or erasing of the non-volatile memory cells 301 and 303. The inverter 331 may include a pFET 671 and an nFET 673 connected in series between the node 337 and the voltage node 317. The inverter 332 may include a pFET 711 and an nFET 713 connected in series between the node 337 and the voltage node 317'. The voltage node 317' may be the same as the voltage node 317 or otherwise configured to receive the same voltage level. The first buffer output node 345 may provide a control signal Q_OUT_BUF representative of a logic level of a data state stored in the differential storage device while the second buffer output node 346 may provide a control signal Q_OUT_N representative of a complement of the logic level of the data state stored in the differential storage device.

As an alternative to connecting the non-volatile memory cells 301 and 303 to the voltage node 317, such as in FIG. 3A, the non-volatile memory cell 301 might have a first source/drain connected to the voltage node 704 and a second source/drain connected to the node 307, while the non-volatile memory cell 303 might have a first source/drain connected to the voltage node 704 and a second source/drain connected to the node 309. The voltage node 704 might be configured to receive the voltage V_SRC, which may be a same voltage as received by the voltage node 317. Separation of the voltage nodes 317 and 704 might be used to improve noise immunity to the non-volatile memory cells 301 and 303, for example. The bodies of the non-volatile memory cells 301 and 303 may be connected to the voltage node 702, which might represent the isolated well structure 302 of FIG. 3A, configured to receive the voltage V_ATUB. The voltage V_ATUB may be a same voltage as received by the voltage node 317 during programming or reading the differential storage device, and may be an erase voltage, e.g., 20V, during an erase operation on the non-volatile memory cells 301 and 303.

The multiplexer 315 may include pFETs (e.g., high-voltage pFETs) 683 and 685 connected in series between the voltage nodes 319 and 321. The gate of the pFET 683 may be connected to the control signal node 687 to receive a control signal DIS_VREF from the logic 305 of FIG. 3A, and the gate of the pFET 685 may be connected to the control signal node 689 to receive a control signal DIS_VPP from the logic 305 of FIG. 3A. The voltage node 319 may be the output of a voltage divider including nFETs 691, 693 and 695 connected in series between the voltage node 349 (e.g., selectively connected through pFET 341) and the voltage node 317. The nFET 695 may be a non-volatile memory cell 695 to permit adjustment of the voltage level of the voltage node 319. For example, the voltage level of the voltage node 319 may be adjusted to a level sufficient to activate an unprogrammed non-volatile memory cell 301 or 303, and insufficient to activate a programmed non-volatile memory cell 301 or 303.

The multiplexer 343 may include pFETs (e.g., high-voltage pFETs) 675 and 677, each connected in series between the voltage signal node 347 and their respective node 307 or 309. The gate of the pFET 675 may be connected to the control signal node 679 to receive a control signal PROG_A_N from the logic 305 of FIG. 3A, and the gate of the pFET 677 may be connected to the control signal node 681 to receive a control signal PROG_B_N from the logic 305 of FIG. 3A. Depending upon the desired voltages, the pFETs 675 and 677 of the multiplexer 343 might instead be nFETs, e.g., high-voltage nFETs.

As depicted in FIG. 6A, the differential storage device of FIGS. 6A-6D may further include nFETs 697 and 701, and pFETs 699 and 703. The nFETs 697 and 701 are each connected in series with the pFETs 699 and 703 between the voltage node 349 and the voltage node 317, and are connected in parallel with each other. The control gates of the nFET 697 and the pFET 699 are each connected to the control signal node 705 to receive a control signal PROG_A, and the control gates of the nFET 701 and the pFET 703 are each connected to the control signal node 707 to receive a control signal PROG_B. The nFETs 697 and 701, and the pFETs 699 and 703, may form a portion of the logic 305 of FIG. 3A.

Figure 6B:
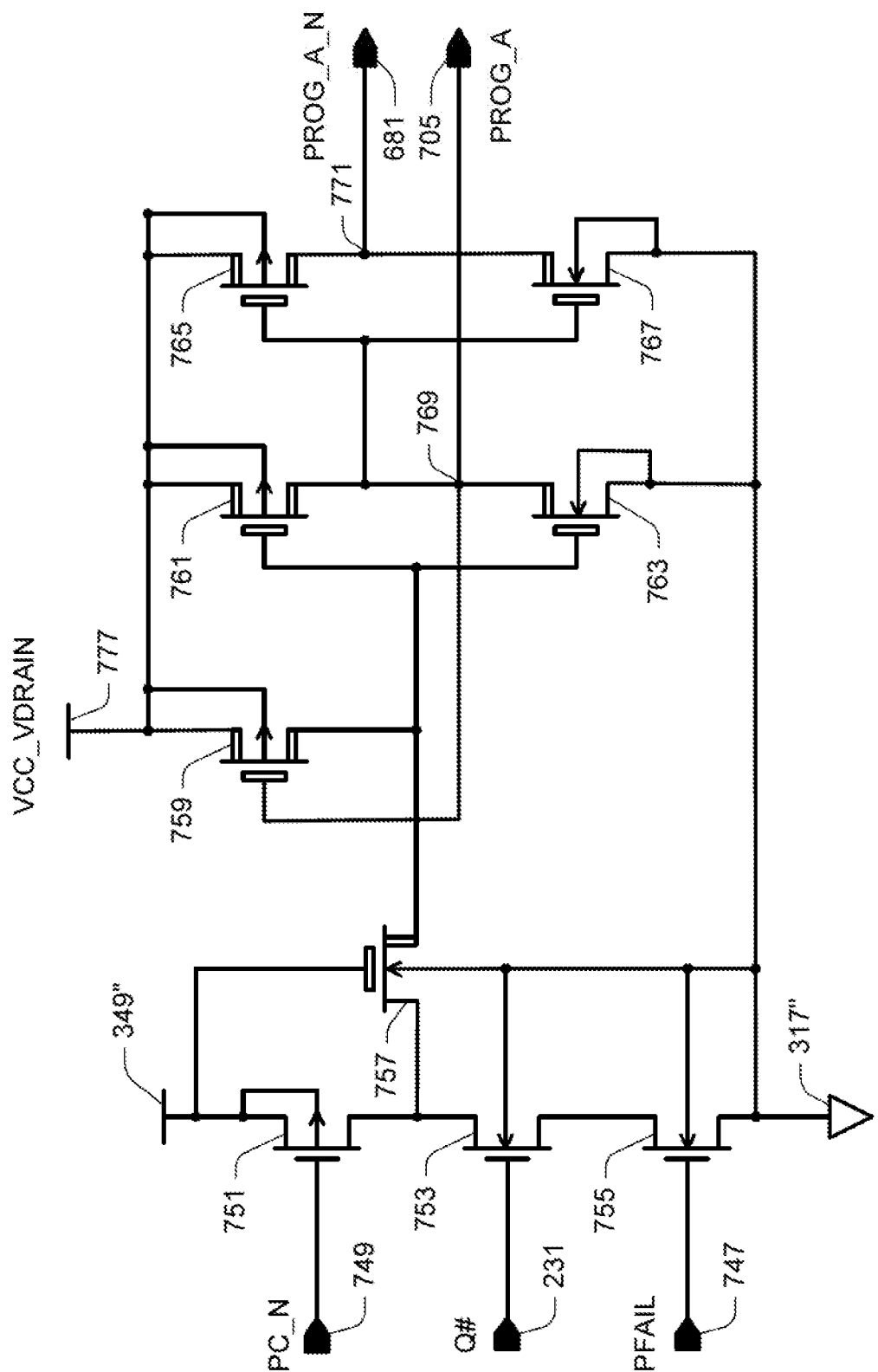

FIG. 6B depicts a level shifter of the differential storage device that may be a portion of the logic 305 of FIG. 3A, and may be configured to generate an output control signal having a voltage level of the voltage node 777, e.g., configured to receive a voltage VCC_VDRAIN. VCC_VDRAIN may be selected to have a voltage level sufficient to program a non-volatile memory cell 301 or 303 when applied to its drain as previously described. The level shifter of FIG. 6B may be a portion of the logic 305 of FIG. 3A.

As depicted in FIG. 6B, pFET 751, nFET 753 and nFET 755 are connected in series between the voltage node 349" and a voltage node 317". The voltage node 349" may be the same as the voltage node 349 of FIG. 6A or otherwise configured to receive the same voltage level. The voltage node 317" may be the same as the voltage node 317 of FIG. 6A or otherwise configured to receive the same voltage level. The gate of the pFET 751 is connected to the control signal node 749 to receive a control signal PC_N, the gate of the nFET 753 is connected to the data bar node 231 of a corresponding SRAM memory cell to receive the control signal Q #, and the gate of the nFET 755 is connected to the control signal node 747 to receive a control signal PFAIL.

The control signal PC_N may normally have a logic high level such that pFET 751 is deactivated, but may be transitioned to a logic low level after power-up to activate the pFET 751 to precharge (e.g., reset) the level shifter of FIG. 6B. The control signal PFAIL may have a logic level indicative of whether a power loss is indicated. Both of these control signals might be received from the control logic 116 of FIG. 1A, for example.

The control signal PFAIL, for example, might be an output signal of a voltage level detection circuit of the control logic 116 that are often used to detect when a supply voltage, such as Vcc, falls below some minimum threshold value. As one example, a supply voltage Vcc may have a specification calling for a nominal value of 3.3V, with a desired (e.g., acceptable) range of 2.7V-3.6V. A voltage detection circuit might be configured to generate the control signal PFAIL having a logic high level if the voltage level of Vcc falls below some threshold value (e.g., some minimum threshold value), such as 2.5V for this example. Such voltage detection circuits are well known in the art, and will not be described herein as they are not the subject of the present disclosure. Adjustments to the threshold value might be warranted to permit operation of a differential storage device in accordance with an embodiment without connection to an auxiliary energy storage device. To continue the foregoing example, if a threshold value of 2.5V would not provide sufficient time to program the non-volatile memory cells of the differential storage device before the supply voltage fell to unusable levels, the threshold value might be increased, and may be increased to some level within the desired range of threshold voltages, e.g., within the range of 2.7V-3.6V in this example. While this might result in unnecessary programming of the differential storage device in response to a dip in power, the non-volatile memory cells of the differential storage device could be erased if the supply voltage returned to its nominal value.

The level shifter of FIG. 6B may further include an nFET (e.g., high-voltage nFET) 757 having a first source/drain connected to a source/drain between the pFET 751 and the nFET 753. The level shifter of FIG. 6B may further include an nFET (e.g., high-voltage nFET) 763 and a pFET (e.g., high-voltage pFET) 761 connected in series between the voltage node 777 and the voltage node 317". The nFET 763 and pFET 761 have their gates connected to a second source/drain of the nFET 757, and to a source/drain of the pFET (e.g., high-voltage pFET) 759 having a second source/drain connected to the voltage node 777.

The level shifter of FIG. 6B may further include an nFET (e.g., high-voltage nFET) 767 and a pFET (e.g., high-voltage pFET) 765 connected in series between the voltage node 777 and the voltage node 317". The nFET 763 and pFET 761 have their gates connected to the node 769 and to the gate of the pFET 759. The node 769 is connected to the control signal node 705 to provide the control signal PROG_A, and the node 771 is connected to the control signal node 681 to provide the control signal PROG_A_N, e.g., the complement of the control signal PROG_A.

Figure 6C:
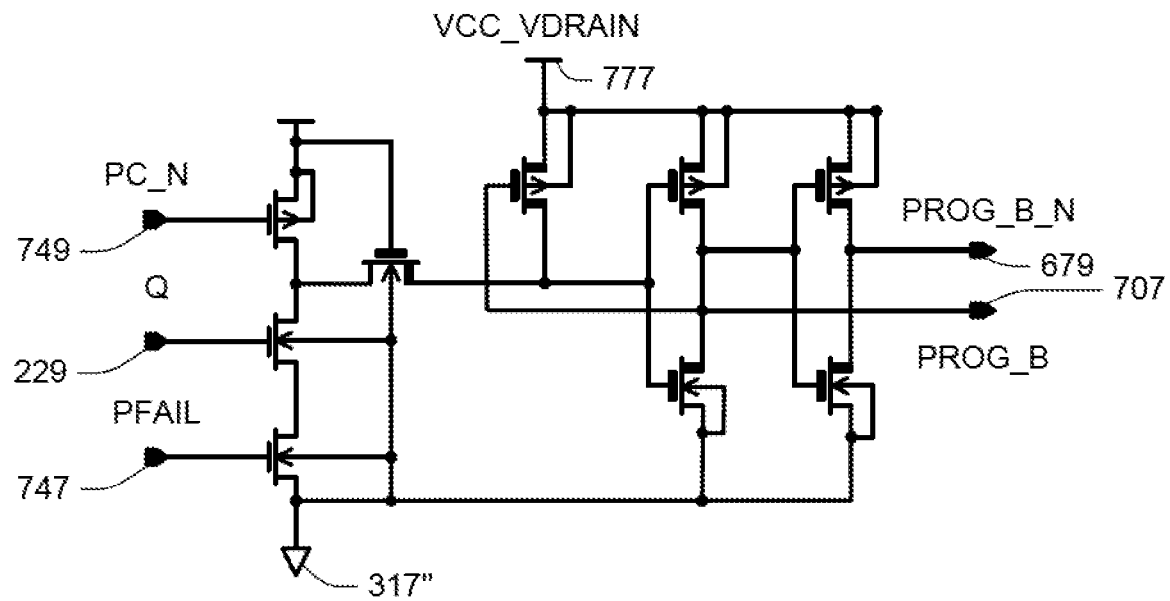

FIG. 6C depicts another level shifter of the differential storage device that may be a portion of the logic 305 of FIG. 3A, and may be configured to generate an output control signal having the voltage level VCC_VDRAIN. The structure of FIG. 6C is depicted to be the same as the structure of FIG. 6B, and will thus only with respect to the differences between the inputs and outputs. Instead of receiving the control signal Q # (e.g., representative of the complement of the data value of the SRAM memory cell) from data bar node 231, the level shifter of FIG. 6C is configured to receive the control signal Q from data node 229. In addition, instead of providing the control signals PROG_A and PROG_A_N at control signal nodes 705 and 681, respectively, the level shifter of FIG. 6C provides the control signals PROG_B and PROG_B_N at control signal nodes 707 and 679, respectively. The control signal PROG_B is generally the complement of the control signal PROG_A, and the control signal PROG_B_N is generally the complement of the control signal PROG_B. The level shifter of FIG. 6C may be a portion of the logic 305 of FIG. 3A.

Figure 6D:
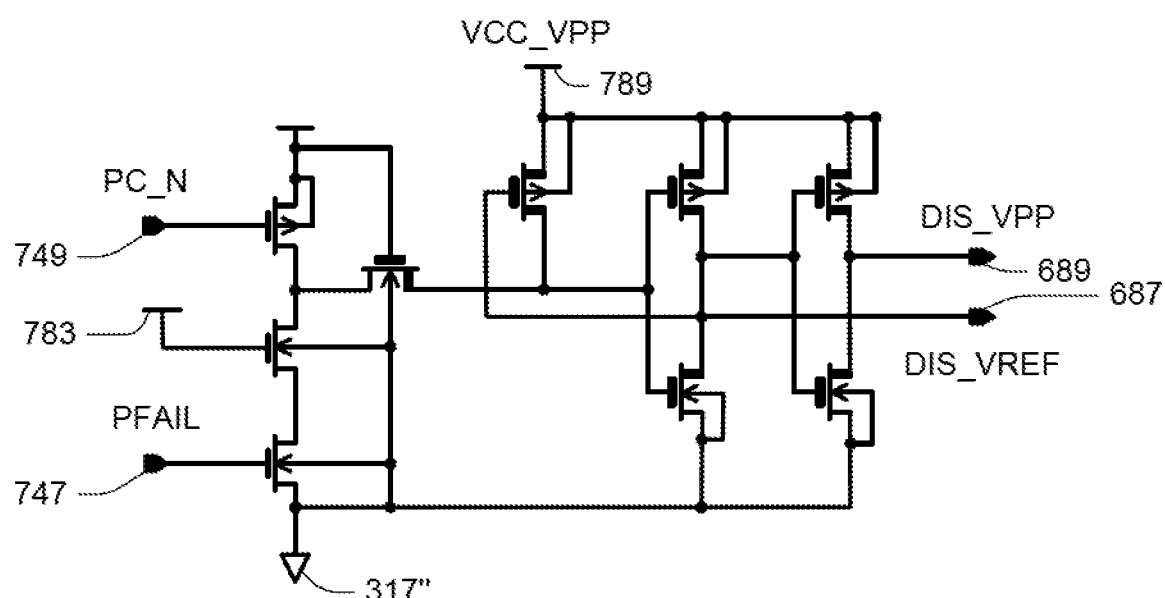

FIG. 6D depicts another level shifter of the differential storage device that may be a portion of the logic 305 of FIG. 3A, and may be configured to generate an output control signal having the voltage level VCC_VPP. The structure of FIG. 6D is depicted to be the same as the structure of FIG. 6B, and will thus only with respect to the differences between the inputs and outputs. Instead of receiving the control signal Q # (e.g., representative of the complement of the data value of the SRAM memory cell) from data bar node 231, the level shifter of FIG. 6D is configured to receive the voltage level of the voltage node 783 (e.g., at the gate of the nFET 753). The voltage node 783 may be configured to receive the same voltage level as the voltage node 349 of FIG. 6A. In addition, instead of providing the control signals PROG_A and PROG_A_N at control signal nodes 705 and 681, respectively, the level shifter of FIG. 6D provides the control signals DIS_VREF and DIS_VPP at control signal nodes 687 and 689, respectively. The control signal DIS_VPP is generally the complement of the control signal DIS_VREF. The level shifter of FIG. 6D may be a portion of the logic 305 of FIG. 3A.

Table 1 may illustrate representative values of the various control signals of FIGS. 6A-6D during normal operation and when a power loss is detected. In Table 1, "0" represents a logic low level, "1" represents a logic high level, and "X" represents "do not care" values of the logic levels. Note that the Read/Write Operation may refer to an operation to both read the differential storage devices, and to write their data values to their corresponding SRAM memory cells, e.g., upon power-up of the memory if the memory indicates that a power loss was experienced.

TABLE 1

| | Normal Operation | Power Loss Detected | Read/Write Operation |
| --- | --- | --- | --- |
| PC_N | 1 (toggle 1-0-1) | 1 | 1 (toggle 1-0-1) |
| PFAIL | 0 | 1 | 0 |
| Q | 1/0 | 1/0 | X |
| Q# | 0/1 | 0/1 | X |
| PROG_A | 0 | 0/1 | 0 |
| PROG_A_N | 1 | 1/0 | 1 |
| PROG_B | 0 | 1/0 | 0 |
| PROG_B_N | 1 | 0/1 | 1 |
| DIS_VREF | 0 | 1 | 0 |
| DIS_VPP | 1 | 0 | 1 |
| SENSE | 0 | 0 | 1 |
| SENSE_N | 1 | 1 | 0 |

With reference to FIGS. 6A-6D, in response to the control signal PFAIL transitioning from a logic low level to a logic high level, the level shifters of FIGS. 6B-6D will generate (e.g., automatically generate) values of the control signals PROG_A, PROG_A_N, PROG_B, PROG_B_N, DIS_VREF and DIS_VPP representative of the values of the control signals Q and Q # indicative of the data value of the corresponding SRAM memory cell. As a result, the nFETs 311 and 313 will be deactivated in response to connecting their gates to the voltage node 317, the voltage VCC_VDRAIN will be applied to a select one of the nodes 307 or 309, and the voltage VCC_VPP will be applied to the gates of the non-volatile memory cells 301 and 303. The non-volatile memory cell 301 or 303 receiving the voltage VCC_VDRAIN at its second source/drain while its first source/drain is connected to the voltage node 317 and its gate is connected to receive the voltage VCC_VPP will be expected to accumulate charge on its data-storage structure, thus increasing its threshold voltage.

Figure 7:
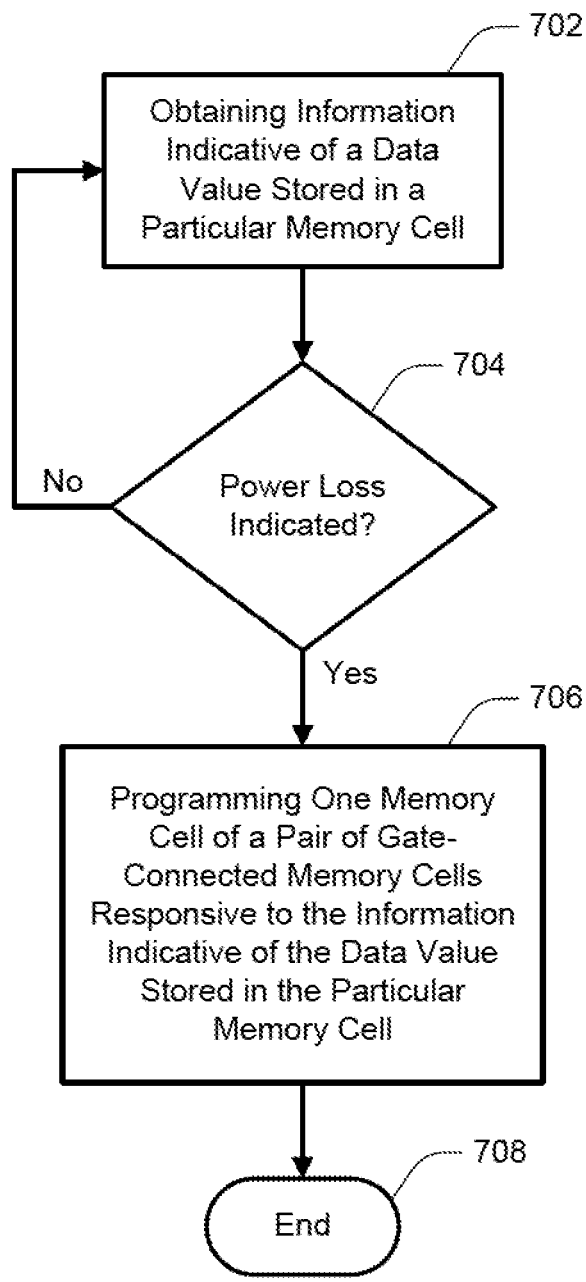
FIG. 7 is a flowchart of a method of operating an apparatus containing a differential storage device in accordance with an embodiment.

FIG. 7 is a flowchart of a method of operating an apparatus, e.g., a memory, containing a differential storage device in accordance with an embodiment. At 702, information indicative of a data value stored in a particular memory cell is obtained. For example, the information may be indicative of a data value of an SRAM memory cell to which the differential storage device is connected, e.g., having an input connected to the data node 229 and an input connected to the data bar node 231 of an SRAM memory cell of the type described with reference to FIGS. 2D-2E.

At 704 it is determined if a power loss is indicated. Power loss may be indicated, for example, by a control signal transitioning from one logic level to a different logic level. If no power loss is indicated at 704, the process may return to 702. If a power loss is indicated at 704, the process may proceed to 706.

At 706, one memory cell of a pair of gate-connected non-volatile memory cells of a differential storage device in accordance with an embodiment may be programmed (e.g., selectively programmed) responsive to the information indicative of the data value stored in the particular memory cell. There may be a respective differential storage device for each memory cell of an array of memory cells, e.g., each memory cell of an array of volatile memory cells. As such, the data values of the array of volatile memory cells may be stored to the pair of gate-connected non-volatile memory cells of their respective differential storage device in the event of a power loss. As noted for some embodiments, storing the data value of a memory cell to a pair of gate-connected non-volatile memory cells does not necessarily require programming of a memory cell of that pair of gate-connected non-volatile memory cells, e.g., where one data value is indicated by the programming of one of the memory cells, and the other data value is indicated by the lack of programming either of the memory cells.

As noted previously, programming times might be shortened compared to programming of a typical array of memory cells, such that it may be possible to obtain sufficient programming of the gate-connected non-volatile memory cells of a differential storage device without the need for an added hold-up capacitance or other auxiliary energy storage device as is typically used to recover from a power loss event. Accordingly, for some embodiments, the voltage nodes of the differential storage device may be devoid of connection to an auxiliary energy storage device.

Figure 8:
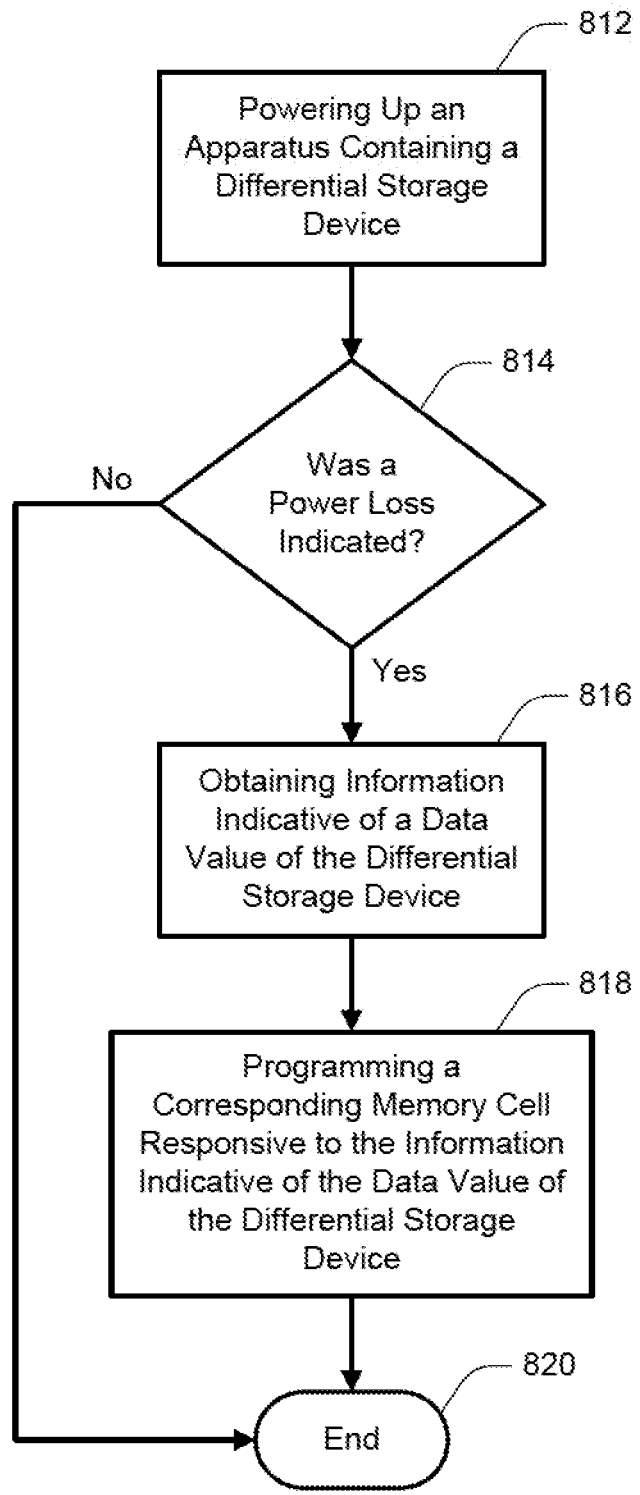
FIG. 8 is a flowchart of a method of operating an apparatus containing a differential storage device in accordance with another embodiment.

FIG. 8 is a flowchart of a method of operating an apparatus, e.g., a memory, containing a differential storage device in accordance with another embodiment. Data values of memory cells stored to differential storage devices in a manner such as described with reference to FIG. 7 may be programmed back to their corresponding memory cells after power-up of an apparatus, e.g., an apparatus containing an array of memory cells and a differential storage array.

At 812, the apparatus is powered up. As is typical of integrated circuit devices containing arrays of memory cells, the apparatus may determine if a power loss was indicated prior to powering down. If a power loss was not indicated at 814, the process may end at 820, e.g., the apparatus may continue with its normal power-up sequence. If a power loss was indicated at 814, the process may proceed to 816.

At 816, information indicative of a data value of the differential storage device is obtained. For example, in the differential storage device of a type such as described with reference to FIGS. 6A-6D, this may include applying a control signal SENSE_N having a logic low level to the control gate of the pFET 341. As a result, logic levels developed at the output nodes 345 and 346, e.g., Q_OUT_BUF and Q_OUT_N, respectively, may indicate the data value of the differential storage device.

At 818, a corresponding memory cell is programmed responsive to the information indicative of the data value of the differential storage device. To continue with the example, and for an SRAM memory cell of a type such as described with reference to FIG. 2E, the logic levels developed at the output nodes 345 and 346 of the differential storage device of FIG. 6A could be applied to the control signal nodes 235 and 237, respectively. In addition, a control signal SENSE having a logic high level could be applied to the control signal node(s) 243. As a result, the memory cell 209E may store (e.g., latch) a corresponding data value in its latch, e.g., FETs 221, 223, 225 and 227.

Figure 9:
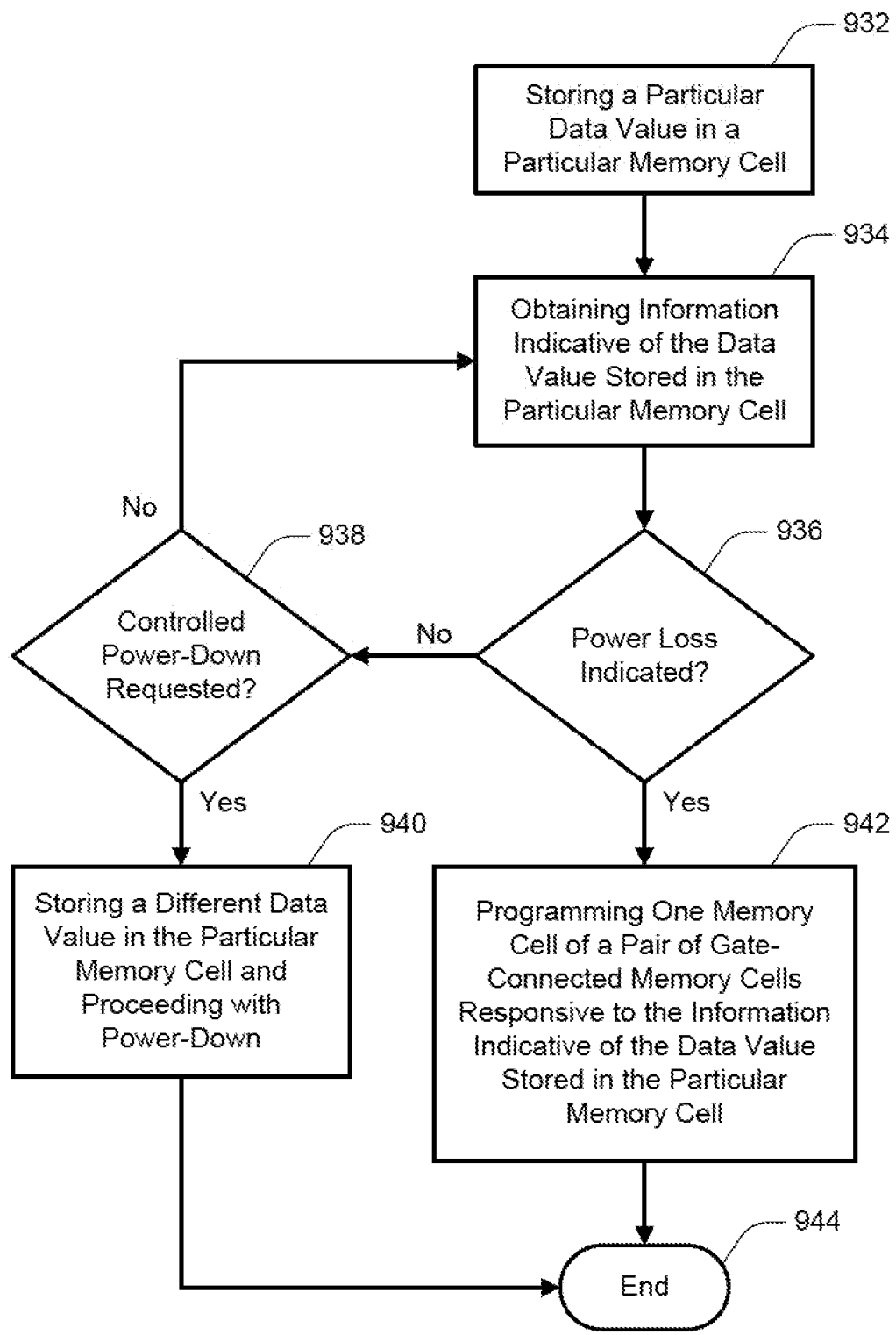
FIG. 9 is a flowchart of a method of operating an apparatus containing a differential storage device in accordance with a further embodiment.

For some embodiments, indicating a power loss may be used to generate (e.g., automatically generate) the control signal SENSE. FIG. 9 is a flowchart of a method of operating an apparatus, e.g., a memory, containing a differential storage device in accordance with a further embodiment.

At 932, a particular data value is stored in a particular memory cell. For example, a data value corresponding to a logic low level of a data node, e.g., data node 229 of a volatile memory cell of a type such as described with reference to FIGS. 2D-2E, might be stored in the particular memory cell (e.g., a '0'). At 934, information indicative of the data value stored in the particular memory cell is obtained. For example, the information may be indicative of a data value of an SRAM memory cell to which the differential storage device is connected, e.g., having an input connected to the data node 229 and an input connected to the data bar node 231 of an SRAM memory cell of the type described with reference to FIGS. 2D-2E.

At 936, it is determined if a power loss is indicated. Power loss may be indicated, for example, by a control signal transitioning from one logic level to a different logic level. If no power loss is indicated at 936, the process may proceed to 938. If a power loss is indicated at 936, the process may proceed to 942. At 942, one memory cell of a pair of gate-connected non-volatile memory cells of a differential storage device in accordance with an embodiment may be programmed (e.g., selectively programmed) responsive to the information indicative of the data value stored in the particular memory cell. The process may then end at 944.

If a power loss was not indicated at 936, it is determined if a controlled power-down is requested at 938. If no controlled power-down is requested at 938, the process may return to 934. If a controlled power-down is requested at 938, a different data value may be stored in the particular memory cell at 940 (e.g., a data value corresponding to a logic high level or a '1'), and the power-down may proceed as normal and then end at 944.

If the differential storage device is of a type such as described with reference to FIG. 5, e.g., having a default data value if no memory cell of the pair of gate-connected memory cells is programmed and having a different data value if one memory cell of the pair of gate-connected memory cells is programmed, an output of the differential storage device can be used to generate the control signal SENSE to cause the array of volatile memory cells to be programmed with the data values of their respective differential storage devices as described with reference to FIG. 8. For example, if the particular data value is a logic low level (e.g., a '0'), the memory cell 301 of FIG. 5 might be programmed in response to the control signal Q having the logic low level, the control signal Q # having the logic high level, and the control signal PFAIL having the logic high level if a power loss is indicated. Upon power-up, the particular differential storage device might produce the control signals Q_OUT_BUF and Q_OUT_N having the logic low level and the logic high level, respectively, and these control signals could be used to indicate whether the control signal SENSE should have the logic high level or the logic low level. For example, the control signal node(s) 243 could be configured to receive the control signal Q_OUT_N, or to receive the complement of the control signal Q_OUT_BUF, e.g., the inverted logic level.

The differential storage device used to indicate power loss and generate the control signal SENSE for restoring an array of volatile memory cells and its corresponding SRAM memory cell may utilize SENSE_N and SENSE control signals that are separately controlled from the SENSE_N and SENSE control signals of the array of volatile memory cells to restore, and their corresponding differential storage devices, e.g., those configured to be connected to the data nodes of the array of volatile memory cells to restore. This may facilitate changing the data value of the SRAM memory cell used in indicating a power loss event without writing data values to any of the remaining SRAM memory cells, for example. Furthermore, after generating the SENSE signal for the remaining SRAM memory cells, the differential storage device used in indicating the power loss event might be erased.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. An apparatus, comprising:
an array of volatile memory cells; and
a differential storage device configured to receive information indicative of a data value stored in a particular memory cell of the array of volatile memory cells, the differential storage device comprising:
  a first non-volatile memory cell connected between a first isolation gate and a voltage node configured to receive a first voltage level;
  a second non-volatile memory cell connected between a second isolation gate and the voltage node, wherein a gate of the second non-volatile memory cell is connected to a gate of the first non-volatile memory cell; and
logic responsive to an indication of a loss of power to the apparatus and the information indicative of the data value stored in the particular memory cell;
  wherein the logic is configured to cause the first isolation gate and the second isolation gate to be deactivated in response to the indication of a loss of power to the apparatus having a particular logic level regardless of a logic level of the information indicative of the data value stored in the particular memory cell;
  wherein the logic is further configured to cause a second voltage level higher than the first voltage level to be applied to gates of the first non-volatile memory cell and the second non-volatile memory cell in response to the indication of a loss of power to the apparatus having its particular logic level regardless of the logic level of the information indicative of the data value stored in the particular memory cell;
  wherein the logic is further configured to cause a third voltage level, less than the second voltage level and greater than the first voltage level, to be applied to a node between the first non-volatile memory cell and the first isolation gate in response to the indication of a loss of power to the apparatus having its particular logic level and the information indicative of the data value stored in the particular memory cell having a particular logic level; and wherein the logic is further configured to cause the first voltage level to be applied to the node between the first non-volatile memory cell and the first isolation gate in response to the indication of a loss of power to the apparatus having its particular logic level and the information indicative of the data value stored in the particular memory cell having a logic level different than its particular logic level.

2. The apparatus of claim 1, wherein the differential storage device has a first input connected to a first data node of the particular memory cell and a second input connected to a second data node of the particular memory cell.

3. The apparatus of claim 2, wherein the particular memory cell comprises a pair of cross-coupled inverters, wherein the first data node of the particular memory cell is an output of one inverter of the pair of cross-coupled inverters, and wherein the second data node of the particular memory cell is an output of the other inverter of the pair of cross-coupled inverters.

4. The apparatus of claim 1, further comprising:
a respective differential storage device for each remaining memory cell of the array of volatile memory cells.

5. The apparatus of claim 4, wherein each respective differential storage device comprises:
a first non-volatile memory cell connected between a first isolation gate and the voltage node;
a second non-volatile memory cell connected between a second isolation gate and the voltage node, wherein a gate of the second non-volatile memory cell is connected to a gate of the first non-volatile memory cell; and
logic responsive to the indication of a loss of power to the apparatus and information indicative of a data value stored in its respective memory cell;
wherein the logic is configured to cause the first isolation gate and the second isolation gate to be deactivated in response to the indication of a loss of power to the apparatus having its particular logic level regardless of a logic level of the information indicative of the data value stored in its respective memory cell;
wherein the logic is further configured to cause the second voltage level to be applied to gates of the first non-volatile memory cell and the second non-volatile memory cell in response to the indication of a loss of power to the apparatus having its particular logic level regardless of the logic level of the information indicative of the data value stored in its respective memory cell;
wherein the logic is further configured to cause the third voltage level to be applied to a node between the first non-volatile memory cell and the first isolation gate in response to the indication of a loss of power to the apparatus having its particular logic level and the information indicative of the data value stored in its respective memory cell having a particular logic level; and
wherein the logic is further configured to cause the first voltage level to be applied to the node between the first non-volatile memory cell and the first isolation gate in response to the indication of a loss of power to the apparatus having its particular logic level and the information indicative of the data value stored in its respective memory cell having a logic level different than its particular logic level.

6. The apparatus of claim 1, wherein the indication of a loss of power to the apparatus comprises an indication of a loss of power to a portion of the apparatus containing the array of memory cells.

7. The apparatus of claim 1, wherein the logic is further configured to:
cause the third voltage level to be applied to a node between the second non-volatile memory cell and the second isolation gate in response to the indication of a loss of power to the apparatus having its particular logic level and the information indicative of the data value stored in the particular memory cell having the logic level different than its particular logic level; and
cause the first voltage level to be applied to the node between the second non-volatile memory cell and the second isolation gate in response to the indication of a loss of power to the apparatus having its particular logic level and the information indicative of the data value stored in the particular memory cell having its particular logic level.

8. The apparatus of claim 1, wherein the apparatus is a vehicle.

9. The apparatus of claim 1, wherein the logic being responsive to the information indicative of the data value stored in the particular memory cell comprises the logic being responsive to complementary control signals indicative of a logic level of the data value stored in the particular memory cell.

10. The apparatus of claim 1, wherein the logic is further responsive to one or more additional control signals.

11. An apparatus, comprising:
an array of volatile memory cells; and
a differential storage device configured to receive information indicative of a data value stored in a particular memory cell of the array of volatile memory cells, the differential storage device comprising:
a first level shifter for generating a first control signal and a second control signal having complementary logic levels responsive to information indicative of a voltage level of a supply voltage relative to a threshold, and to the information indicative of the data value stored in the particular memory cell, wherein the supply voltage is used for access of the array of volatile memory cells;
a second level shifter for generating a third control signal and a fourth control signal having complementary logic levels responsive to the information indicative of the voltage level of the supply voltage relative to the threshold, and to the information indicative of the data value stored in the particular memory cell;
a third level shifter for generating a fifth control signal and a sixth control signal having complementary logic levels responsive to the information indicative of the voltage level of the supply voltage relative to the threshold;
a first non-volatile memory cell connected in series between a first node and a first voltage node;
a second non-volatile memory cell connected in series between a second node and the first voltage node;

a first isolation gate connected in series between a third node and the first node; and a second isolation gate connected in series between a fourth node and the second node;

wherein, when the information indicative of the voltage level of the supply voltage relative to the threshold indicates that the voltage level of the supply voltage is greater than the threshold, the first control signal, the third control signal and the fifth control signal each have a first logic level, and the second control signal, the fourth control signal and the sixth control signal each have a second logic level different than the first logic level;

wherein, when the information indicative of the voltage level of the supply voltage relative to the threshold indicates that the voltage level of the supply voltage is less than the threshold, and the information indicative of the data value stored in the particular memory cell is indicative of the data value having a particular logic level, the second control signal, the third control signal and the sixth control signal each have the first logic level, and the first control signal, the fourth control signal and the fifth control signal each have the second logic level;

wherein, when the information indicative of the voltage level of the supply voltage relative to the threshold indicates that the voltage level of the supply voltage is less than the threshold, and the information indicative of the data value stored in the particular memory cell is indicative of the data value having a different logic level, the first control signal, the fourth control signal and the sixth control signal each have the first logic level, and the second control signal, the third control signal and the fifth control signal each have the second logic level;

wherein the first isolation gate and the second isolation gate are configured to receive a gate voltage having a first voltage level when either the first control signal or the third control signal has the second logic level, and to receive a gate voltage having a second voltage level higher than the first voltage level when both the first control signal and the third control signal have the first logic level;

wherein the first non-volatile memory cell and the second non-volatile memory cell are configured to receive a gate voltage having a third voltage level between the first voltage level and the second voltage level when the fifth control signal has the first logic level, and to receive a gate voltage having a fourth voltage level higher than the second voltage level when the sixth control signal has the first logic level;

wherein the first node is configured to receive a fifth voltage level between the first voltage level and the third voltage level when the second control signal has the first logic level; and wherein the second node is configured to receive the fifth voltage level when the fourth control signal has the first logic level.

12. The apparatus of claim 11, further comprising:
a first multiplexer having an input configured to receive the fifth voltage level, wherein the first multiplexer is responsive to the second control signal and the fourth control signal to selectively connect either the first node or the second node to its input.

13. The apparatus of claim 12, further comprising:
a second multiplexer having a first input configured to receive the third voltage level and a second input configured to receive the fourth voltage level, wherein the second multiplexer is responsive to the fifth control signal and the sixth control signal to selectively connect either the first input or the second input to each of the first memory cell and the second memory cell.

14. A method of operating an apparatus, comprising:
in response to powering up the apparatus, determining if a power loss to the apparatus was indicated; and
if a power loss to the apparatus was indicated:
obtaining information indicative of a data value of a differential storage device of the apparatus in response to a difference in current flow through each non-volatile memory cell of a pair of gate-connected non-volatile memory cells of the differential storage device; and
programming a corresponding memory cell of an array of volatile memory cells of the apparatus responsive to the information indicative of the data value of the differential storage device.

15. The method of claim 14, wherein the differential storage device is one differential storage device of a plurality of differential storage devices of the apparatus, the method further comprising:
obtaining information indicative of respective data values of each differential storage device of the plurality of differential storage devices if a power loss to the apparatus was indicated; and
for each differential storage device of the plurality of differential storage devices, programming a respective corresponding memory cell of the array of volatile memory cells responsive to the information indicative of the respective data value of that differential storage device.

16. The method of claim 14, wherein the differential storage device is a first differential storage device of the apparatus, and wherein determining if a power loss to the apparatus was indicated comprises determining a data value of a second differential storage device of the apparatus.

17. A method of operating an apparatus, comprising:
in response to powering up the apparatus, determining if a power loss to the apparatus was indicated; and
if a power loss to the apparatus was indicated:
obtaining information indicative of a data value of a first differential storage device of the apparatus; and
programming a corresponding memory cell of an array of volatile memory cells of the apparatus responsive to the information indicative of the data value of the first differential storage device;
wherein determining if a power loss to the apparatus was indicated comprises determining a data value of a second differential storage device of the apparatus; and
wherein the second differential storage device comprises a first non-volatile memory cell having a first source/drain connected to a first voltage node configured to receive a first voltage level and a second source/drain selectively connected to a second voltage node configured to receive a second voltage level greater than the first voltage level, and a second non-volatile memory cell having a first source/drain connected to the first voltage node and a second source/drain selectively connected to the second voltage node, wherein a gate of the second non-volatile memory cell is connected to a gate of the first non-volatile memory cell, and wherein determining the data value of the second differential storage device comprises:

connecting the second source/drain of the first non-volatile memory cell and the second source/drain of the second non-volatile memory cell to the second voltage node;

selectively isolating either the second source/drain of the first non-volatile memory cell or the second source/drain of the second non-volatile memory cell in response to a difference in current flow through the first non-volatile memory cell and the second non-volatile memory cell; and determining the data value of the second differential storage device in response to voltage levels developed at the second source/drain of the first non-volatile memory cell and the second source/drain of the second non-volatile memory cell.

18. A method of operating an apparatus, comprising:

in response to powering up the apparatus, determining if a power loss to the apparatus was indicated; and if a power loss to the apparatus was indicated:

obtaining information indicative of a data value of a first differential storage device of the apparatus; and programming a corresponding memory cell of an array of volatile memory cells of the apparatus responsive to the information indicative of the data value of the first differential storage device;

wherein powering up the apparatus comprises powering up the apparatus for a particular occurrence of a plurality of occurrences of powering up the apparatus, the method further comprising:

prior to powering up the apparatus for the particular occurrence, and subsequent to powering up the apparatus for an immediately prior occurrence of the plurality of occurrences, selectively programming one non-volatile memory cell of a pair of gate-connected non-volatile memory cells of a second differential storage device of the apparatus to indicate a power loss to the apparatus.

19. The method of claim 18, wherein selectively programming the one non-volatile memory cell of the pair of gate-connected non-volatile memory cells of the second differential storage device comprises selectively programming the one non-volatile memory cell of the pair of gate-connected non-volatile memory cells of the second differential storage device in response to determining that a power loss to the apparatus is indicated subsequent to powering up the apparatus for the immediately prior occurrence.

20. A method of operating an apparatus, comprising:

in response to powering up the apparatus, determining if a power loss to the apparatus was indicated; and if a power loss to the apparatus was indicated:

obtaining information indicative of a data value of a differential storage device of the apparatus; and programming a corresponding memory cell of an array of volatile memory cells of the apparatus responsive to the information indicative of the data value of the differential storage device;

wherein the differential storage device comprises a first non-volatile memory cell having a first source/drain connected to a first voltage node configured to receive a first voltage level and a second source/drain selectively connected to a second voltage node configured to receive a second voltage level greater than the first voltage level, and a second non-volatile memory cell having a first source/drain connected to the first voltage node and a second source/drain selectively connected to the second voltage node, wherein a gate of the second non-volatile memory cell is connected to a gate of the first non-volatile memory cell, and wherein obtaining the information indicative of the data value of the differential storage device comprises:

connecting the second source/drain of the first non-volatile memory cell and the second source/drain of the second non-volatile memory cell to the second voltage node;

selectively isolating either the second source/drain of the first non-volatile memory cell or the second source/drain of the second non-volatile memory cell in response to a difference in current flow through the first non-volatile memory cell and through the second non-volatile memory cell; and determining the data value of the differential storage device in response to voltage levels developed at the second source/drain of the first non-volatile memory cell and the second source/drain of the second non-volatile memory cell.

* * * * *